(12) United States Patent
Nishi

(10) Patent No.: US 6,462,807 B1
(45) Date of Patent: Oct. 8, 2002

(54) PROJECTION EXPOSURE APPARATUS AND METHOD

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/572,560

(22) Filed: May 16, 2000

Related U.S. Application Data

(63) Continuation of application No. 09/195,989, filed on Nov. 20, 1998, now abandoned, which is a division of application No. 08/906,429, filed on Aug. 5, 1997, now Pat. No. 5,854,671, which is a continuation of application No. 08/547,147, filed on Oct. 24, 1995, now abandoned, which is a continuation-in-part of application No. 08/254,672, filed on Jun. 6, 1994, now Pat. No. 5,473,410, which is a continuation of application No. 08/068,101, filed on May 28, 1993, now abandoned.

(30) Foreign Application Priority Data

Oct. 24, 1994 (JP) .............................. 6-257835
Sep. 1, 1997 (WO) .................. PCT/EP/04739

(51) Int. Cl.$^7$ ........................ G03B 27/42; G03B 27/54; G01N 21/00; A61N 5/00

(52) U.S. Cl. ........................ 355/53; 355/67; 250/491.1; 250/492.2

(58) Field of Search ............................. 355/53, 55, 67, 355/74, 77, 71, 75; 250/492.2, 491.1

(56) References Cited

U.S. PATENT DOCUMENTS

| | | | | |
|---|---|---|---|---|
| 3,819,265 A | * | 6/1974 | Feldman et al. ................ 355/51 |
| 4,030,825 A | * | 6/1977 | Ghougasian .................. 355/71 |
| 4,191,466 A | * | 3/1980 | Gandini ........................ 355/53 |
| 4,699,515 A | | 10/1987 | Tanimoto ..................... 356/40 |
| 4,734,746 A | * | 3/1988 | Ushida et al. ................. 355/53 |
| 4,747,678 A | * | 5/1988 | Shafer ......................... 350/505 |
| 4,918,320 A | * | 4/1990 | Hamasaki et al. ........... 250/548 |
| 4,924,257 A | * | 5/1990 | Jain ............................. 355/53 |
| 4,953,960 A | * | 9/1990 | Williamson ................. 350/442 |
| 5,089,913 A | * | 2/1992 | Singh et al. ................. 359/727 |
| 5,105,075 A | * | 4/1992 | Ohta et al. ..................... 355/53 |
| 5,194,893 A | * | 3/1993 | Nishi ........................... 355/53 |
| 5,214,489 A | * | 5/1993 | Mizutani et al. ............. 356/363 |
| 5,227,839 A | * | 7/1993 | Allen .......................... 355/53 |
| 5,238,870 A | * | 8/1993 | Tanaka ........................ 437/173 |
| 5,281,996 A | * | 1/1994 | Bruning et al. ................ 355/77 |
| 5,285,236 A | * | 2/1994 | Jain ............................. 355/53 |

(List continued on next page.)

FOREIGN PATENT DOCUMENTS

| | | |
|---|---|---|
| JP | 63-128713 | 6/1988 |
| JP | 1-91419 | 4/1989 |

OTHER PUBLICATIONS

Tracy et al., "Exposure Dose Control Techniques for Excimer Laser Lithography" in SPIE vol. 922 Optical/Laser Microlithography, 1988.

Rominger, "Seamless Stiching for Large Area Integrated Circuit Manufacturing" in SPIE vol. 922 Optical/Laser Microlithography, 1988.

Buckley et al., "Step and scan: A systems overview of a new lithography tool" in SPIE vol. 1088 Optical/Laser Microlithography II, 1989.

Primary Examiner—Russell Adams
Assistant Examiner—Rodney Fuller
(74) Attorney, Agent, or Firm—Miles & Stockbridge P.C.

(57) ABSTRACT

A scanning exposure apparatus and method employ a first masking member to define a width of an illumination area and a second masking member to change the illumination area during movement of a mask and a substrate relative to illumination light during scanning exposure. The mask or the substrate is rotated about a predetermined point in the illumination area during the scanning exposure to correct a relative rotation error between the mask and the substrate.

28 Claims, 14 Drawing Sheets

U.S. PATENT DOCUMENTS

| | | | |
|---|---|---|---|
| 5,289,231 A | | 2/1994 | Magome et al. .............. 355/53 |
| 5,291,240 A | * | 3/1994 | Jain ............................. 355/53 |
| 5,365,342 A | * | 11/1994 | Ayata et al. ................ 356/401 |
| 5,473,410 A | * | 12/1995 | Nishi ........................... 355/53 |
| 5,656,402 A | * | 8/1997 | Kasuga ........................ 430/22 |
| 5,661,546 A | * | 8/1997 | Taniguchi .................... 355/53 |
| 5,677,754 A | * | 10/1997 | Makinouchi ................. 355/53 |
| 5,835,196 A | * | 11/1998 | Jackson ....................... 355/53 |
| 5,854,671 A | * | 12/1998 | Nishi ........................... 355/53 |
| 5,912,727 A | * | 6/1999 | Kawai .......................... 355/67 |
| 6,018,395 A | * | 1/2000 | Mori et al. ................. 356/401 |
| 6,072,184 A | * | 6/2000 | Okino et al. ............. 250/492.2 |
| 6,118,517 A | * | 9/2000 | Sasaki et al. ................ 355/53 |

\* cited by examiner

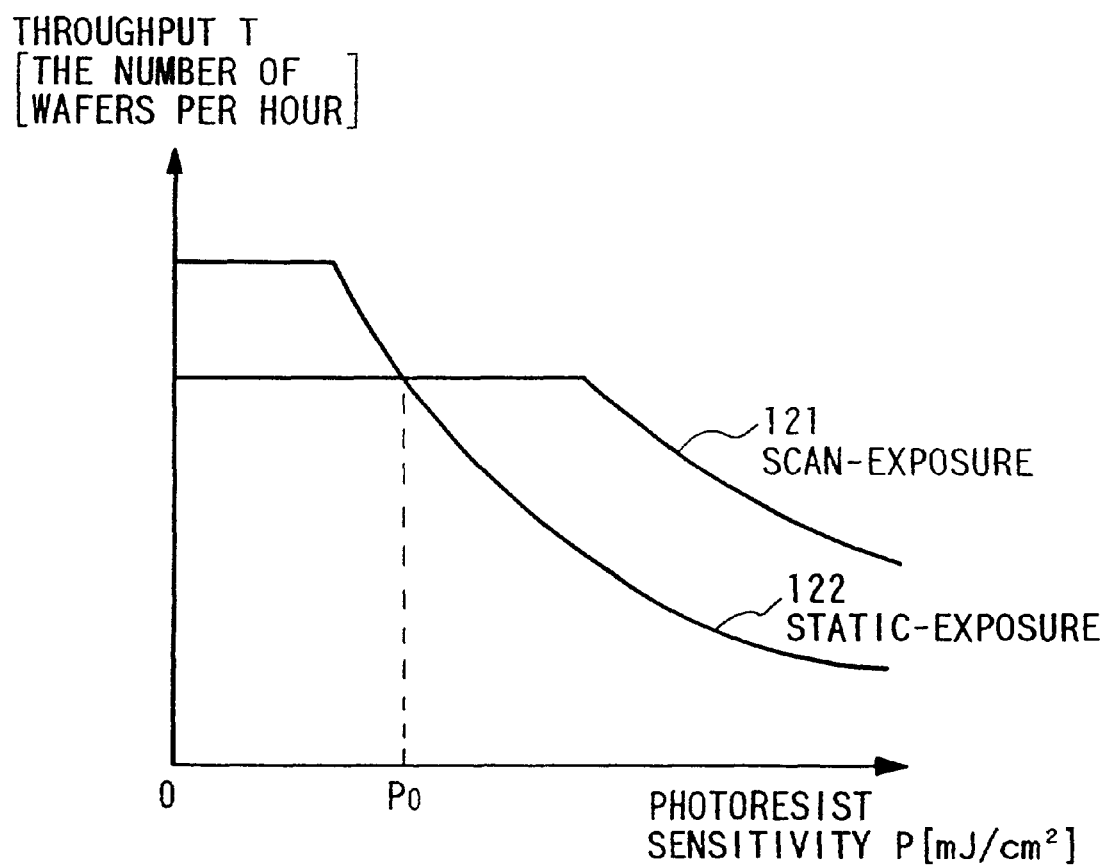

PROJECTION EXPOSURE APPARATUS AND METHOD

CROSS-REFERENCE TO RELATED APPLICATION

This application is a continuation of application Ser. No. 09/195,989 filed Nov. 20, 1998 now abandoned, which is a division of application Ser. No. 08/906,429 filed Aug. 5, 1997 now U.S. Pat. No. 5,854,671, which is a continuation of application Ser. No. 08/547,147 filed Oct. 24, 1995 now abandoned, which is a continuation-in-part of application Ser. No. 08/254,672 filed Jun. 6, 1994 (now U.S. Pat. No. 5,473,410), which is a continuation of application Ser. No. 08/068,101 filed May 28, 1993 (now abandoned).

BACKGROUND OF THE INVENTION

1. Field of the Invention

The present invention relates to a projection exposure apparatus for use in a lithography step in the course of manufacturing a semiconductor element, a liquid crystal display element, etc.

The present invention relates to a projection exposure method and a projection exposure apparatus for use in transfer-exposure of a mask pattern onto a photosensitive substrate when, for example, a semiconductor element, a liquid crystal display element, or the like, is manufactured by a lithography process, and in particular, to a projection exposure method and apparatus for effecting an exposure by switching the step-and-repeat method with the step-and-scan method.

2. Related Background Art

This kind of projection exposure apparatus has hitherto been classified roughly into two types. One of them may involve the use of a method of exposing a photosensitive substrate such as a wafer, a plate, etc. by a step-and-repeat method through a projection optical system having an exposure field capable of including a whole pattern of a mask (reticle). The other type may involve the use of a scan method of effecting the exposure with a relative scan performed under mask illumination of arched slit illumination light, wherein the mask and the photosensitive substrate are disposed in a face-to-face relationship with the projection optical system interposed therebetween.

A stepper adopting the former step-and-repeat exposure method is a dominant apparatus in the recent lithography process. The stepper exhibits a resolving power, an overlap accuracy and a throughput which are all higher than in an aligner adopting the latter scan exposure method. It is considered that the stepper will continue to be dominant for some period from now on into the future.

By the way, a new scan exposure method for attaining a high resolving power has recently been proposed as a step-and-scan method on pp. 424–433 of Optical/Laser Microlithography II (1989), SPIE Vol. 1088. The step-and-scan method is a combined version of the scan method of one-dimensionally scanning the wafer at a speed synchronizing therewith while one-dimensionally scanning the mask (reticle) and a method of moving the wafer stepwise in a direction orthogonal to a scan-exposure direction.

FIG. 1 is an explanatory view showing a concept of the step & scan method. Herein, shot regions (one chip or multi-chips) arranged in an X-direction on a wafer W are scan-exposed by beams of arched slit illumination light RIL. The wafer W is stepped in a Y-direction. Referring to the same Figure, arrows indicated by broken lines represent a route of the step & scan (hereinafter abbreviated to S & S) exposure. The shot regions undergo the same S & S exposure in the sequence such as $SA_1$, $SA_2$, . . . $SA_6$. Subsequently, the same S & S exposure is performed on the shot regions in the sequence such as $SA_7$, $SA_8$, . . . $SA_{12}$ arranged in the Y-direction at the center of the wafer W. In the aligner based on the S & S method disclosed in the above-mentioned literature, an image of the reticle pattern illuminated with the arched slit illumination light RIL is formed on the wafer W via a ¼ reduction projection optical system. Hence, an X-directional scan velocity of the reticle stage is accurately controlled to a value that is four times the X-directional scan velocity of the wafer stage. Further, the reason why the arched slit illumination light RIL is employed is to obtain such advantages that a variety of aberrations become substantially zero in a narrow (zonal) range of an image height point spaced a given distance apart from the optical axis by using a reduction system consisting of a combination of a refractive element and a reflex element as a projection optical system. One example of such a reflex reduction projection system is disclosed in, e.g., U.S. Pat. No. 4,747,678.

Proposed in, e.g., Japanese Patent Laid-open Application No. 2-229423 (U.S. Pat. No. 4,924,257) is an attempt to apply a typical projection optical system (full field type) having a circular image field to an S & S exposure method other than the above-described S & S exposure method which uses the arched slit illumination light. The following are particulars disclosed in this Patent Laid-open Application. Exposure light with which the reticle (mask) is illuminated takes a regular hexagon inscribed to a circular image field of a projection lens system. Two face-to-face edges of the regular hexagon extend in a direction orthogonal to the scan-exposure direction. It is thus attained the S & S exposure exhibiting a more improved throughput. That is, this Patent Laid-open Application shows that the scan velocities of the reticle stage and of the wafer stage can be set much higher than by the S & S exposure method using the arched slit illumination light by taking an as large reticle (mask) illumination region in the scan-exposure direction as possible.

According to the above-described prior art disclosed in Japanese Patent Laid-open Application No. 2-229423, the mask illumination region is enlarged in the scan-exposure direction to the greatest possible degree. This is therefore advantageous in terms of the throughput.

By the way, there is nothing but to take the zig-zag S & S method shown in FIG. 1 even in the apparatus disclosed in the above-mentioned Patent Laid-open Application in consideration of actual scan sequences of mask stage and the wafer stage.

The reason for this is given as follows. A diameter of the wafer W is set to 150 mm (6 inch). When trying to complete the exposure of one-row shot regions corresponding to the wafer diameter by only one continuous X-directional scan, the premise is that a ⅕ projection lens system is employed. Based on this premise, a scan-directional (X-directional) length is as long as 750 mm (30 inch). It is extremely difficult to manufacture this kind of reticle. Even if such a reticle can be manufactured, a stroke of the reticle stage for scanning the reticle in the X-direction requires 750 mm or more. Therefore, the apparatus invariably highly increases in size. For this reason, there is no alternative but to perform the zig-zag scan even in the apparatus disclosed in the above-mentioned Patent Laid-open Application.

It is therefore required that the periphery of the pattern region on the reticle be widely covered with a light shielding substance so as not to transfer the reticle pattern within an adjacent shot region with respect to, e.g., the shot regions $SA_1$, $SA_{12}$ shown in FIG. 1.

FIGS. 2A and 2B each illustrate a layout of a hexagonal illumination region HIL, a circular image field IF of the projection lens system and a reticle R during a scan exposure. FIG. 2A shows a state where the hexagonal illumination region HIL is set in a start-of-scan position on the reticle R. Only the reticle R one-dimensionally moves rightward in the same Figure from this state. FIG. 2B illustrates a state at the end of one scanning process.

Referring to FIGS. 2A and 2B, the symbols $CP_1$, $CP_2$, . . . $CP_6$ represent chip patterns formed in row in the X-direction on the reticle R. A row of these six chip patterns correspond to the shot regions to be exposed by one scanning process in the X-direction. Note that in the same Figures, the central point of the hexagonal illumination region HIL coincides substantially with the center of the image field, i.e., an optical axis AX of the projection lens system.

As obvious from FIGS. 2A and 2B, the light shielding substance equal to or larger than at least a scan-directional width dimension of the hexagonal illumination region HIL is needed for the exterior of the pattern region in the start- and end-of-scan areas on the reticle R. Simultaneously, a scan-directional dimension of the reticle R itself also increases. An X-directional moving stroke of the reticle stage is also needed corresponding to a total of an X-directional dimension of the entire patterns $CP_1$–$CP_6$ and a scan-directional dimension of the hexagonal illumination region HIL. Those are thinkable problems in terms of shaping up an apparatus.

Also since being optimized for either the step-and-repeat method or the step-and-scan method, the prior-art projection exposure apparatus unavoidably has disadvantages of each of the methods. The disadvantages belonging to the two methods are described in the following.

A. step-and-repeat method

1. In order to increase an area for patterns to be transferred on the reticle, it is necessary to increase a lens diameter of the projection optical system. Thus, the increase of the area is limited together when the manufacturing cost of the projection optical system increases.

2. Since an exposure field to be effected by the projection optical system is in the shape of a square substantially inscribed to an effective exposure field, a distortion of said exposure field becomes larger and an overlap accuracy is deteriorated when the exposure is effected on a layer having a different wafer by use of a different projection exposure apparatus (matching).

3. since the area of an exposure field to be exposed simultaneously is large and an exposure energy (a degree of illuminance) per unit area is small, it is necessary to prolong the exposure time when a resist having a low sensitivity is used, whereby a throughput is decreased.

B. step-and-scan method

1. Though the projection optical system can be manufactured at low cost, the manufacturing cost of a stage mechanism becomes high since it is necessary to scan the reticle and the wafer in synchronization. Moreover, when a resist having a high sensitivity is used, it is necessary to shorten the exposure time. For this reason, the scan velocity of the reticle stage is required to be higher. As a result, the manufacturing cost increases.

2. Due to vibration at the scan-exposure time and an averaging of the distortions in the projection optical system, the image forming performance is deteriorated.

3. When an overlap exposure is effected on different layers on the wafer by use of a single projection exposure apparatus, a distortion becomes different for each exposure. As a result, the overlap accuracy is deteriorated.

SUMMARY OF THE INVENTION

It is a primary object of the present invention, which has been devised in view of the foregoing problems, to provide a projection exposure apparatus by a scan method (or an S & S method) exhibiting an increased throughput by minimizing a moving stroke of a reticle stage during a scan-exposure without providing a specially wide light shielding substance along the periphery of a pattern exposure region on a reticle (mask).

To accomplish this object, according to one aspect of the present invention, there is provided a projection exposure apparatus by a scan-exposure method, including an illuminating means for illuminating a mask transfer region with illumination light for an exposure through an aperture of a variable field stop disposed in a position substantially conjugate to the mask. This apparatus also includes a driving means for configuring the aperture of the variable field stop in a rectangular shape (having edges orthogonal to a direction of the scan-exposure) and simultaneously making variable a width of the rectangular aperture of the stop in a widthwise direction (the scan-exposure direction) of the transfer region (pattern forming region) on the mask.

The projection exposure apparatus further includes a control means for controlling the driving means to change a width of the rectangular aperture of the variable field stop in interlock with variations in position of the variable field stop on the mask transfer region which varies due to the one-dimensional movements of the mask stage.

Based on the conventional scan-exposure method, the mask is irradiated with the illumination light via an aperture in a fixed shape (hexagon, arched illumination area, etc.). According to the present invention, however, the scan-directional width of the aperture (variable field stop) is varied interlocking with a scan of the mask or the photosensitive substrate. The same S & S exposure method can be therefore realized simply by sequentially narrowing the aperture width without causing a large overrun of the mask in the start- and end-of-scan areas on the mask. Accordingly, the overrun of the mask stage is eliminated in terms of its necessity or extremely reduced, whereby the moving stroke of the mask stage can be minimized. At the same time, the width of the light shielding substance formed along the periphery of the pattern forming region on the mask may also be small to the same extent as that in the conventional mask. The advantage lies in a decrease in labor for inspecting a pin hole defect in the light shielding substance (normally, a chrome layer) during a manufacturing process of the mask.

Further, the aperture of the variable field stop is set in a shape adapted to the pattern forming region on the mask, thereby making it possible to utilize the apparatus also as a stepper equal to the conventional one.

Besides, an aperture position and a geometrical configuration of the variable field stop are set to cause variations one-dimensionally, two-dimensionally or in a rotational direction within the image field of the projection optical system. It is thus feasible to instantaneously correspond to mask patterns of a variety of chip sizes.

As explained above, according to the present invention, it is possible to minimize the moving stroke of the mask (reticle) in accordance with the scan-exposure method. A dimension of the light shielding band on the mask can also be reduced.

At the same time, the scan-directional illumination region on the mask can be taken large, and, therefore, the throughput can be remarkably enhanced in combination with a diminution in the moving stroke.

It is another object of the present invention, which has been devised in view of the foregoing problems, to provide a projection exposure method capable of enjoying the advantages of the step-and-repeat method and the step-and-scan method and capable of compensating the disadvantages of the step-and-repeat method and the step-and-scan method, as well as a projection exposure apparatus which can be used in embodying such a projection exposure apparatus.

To accomplish this object, according to the present invention, there is provided a projection exposure method which has a step-and-repeat mode and a step-and-scan mode, to effect an exposure in either the step-and-repeat mode or the step-and-scan by using at least one of information pieces on a layout of a plurality of shot regions on a photosensitive substrate, a quantity of integrated exposure required on the photosensitive substrate, configurations of these shot regions, a resolving power required for pattern images of a mask, and an allowance for distortions. Therefore, it is possible to realize an exposure method which can make the most of only the advantages of both the step-and-repeat mode and the step-and-scan mode, and is excellent in terms of all the performances including the throughput (the number of wafers to be processed per unit time) and the image forming performance, etc.

According to the projection exposure apparatus of the present invention, it is possible to use the above-mentioned exposure method.

According to the present invention, one of the both exposure methods is selected in one of the following manners.

1) An exposure time for one photosensitive substrate is calculated on the basis of a layout of the shot regions, required quantity of integrated exposure, etc. Then, an exposure method having the shorter exposure time is selected.

2) When a configuration of the shot region exceeds the width of an effective exposure field of the projection optical system with respect to a scan direction in the step-and-scan mode, the step-and-scan mode is selected.

3) An exposure mode which can satisfy both the resolving power required for an exposure of mask patterns and an allowance for distortions is selected.

When, for example, an exposure is effected in the step-and-scan mode for each shot region on the photosensitive substrate, if movements among the shot regions are conducted in a direction orthogonal to the scan direction, as indicated by a locus, the exposure time is reduced. On the other hand, when the exposure for each shot region is effected in the step-and-repeat mode, the movements among the shot regions are conducted in the short-side direction, as indicated by a locus. Then, the exposure time is reduced. Therefore, a stepping direction of the photosensitive substrate is switched over in accordance with a selected exposure mode, whereby the exposure time is further reduced.

Moreover, in order to make uniform a distribution of luminance on the mask, it is preferable to dispose an optical integrator in an illumination optical system. In this case, since a cross-sectional configuration of an optical element of the optical integrator is substantially the same as that of an illumination region on the mask, if the exposure mode is switched over to change the configuration of the illumination region on the mask, the optical integrator equipped with an optical element having a cross-sectional configuration substantially equal to the configuration of said illumination region is used to improve the illumination efficiency.

According to the present invention, an exposure is effected in the step-and-scan mode or the step-and-repeat mode, whichever is optimal, in accordance with a layout of shot regions on the photosensitive substrate, or the like. Therefore, when, for example, mask patterns to be exposed (or shot regions on the photosensitive substrate) occupy an elongated area, the step-and-scan mode is adopted, while the step-and-repeat mode is adopted when the sensitivity of the photosensitive substrate is high and the exposure time is further reduced in the step-and-repeat mode. Thus, it is possible to make the most of the advantages of both the step-and-repeat method and the step-and-scan method fully.

On the other hand, the step-and-repeat mode in which the distortion characteristics are substantially fixed is adopted when the overlap exposure is effected by use of a single projection exposure apparatus and a high overlap accuracy (high alignment accuracy) is intended to be kept, while the scan-exposure mode in which a degree of luminance is enhanced with a slit-like exposure region is adopted. Thus, it is possible to make up for the disadvantages of the step-and-scan method and the step-and-repeat method.

When a direction of a stepping movement among the shot regions on the photosensitive substrate is switched over in accordance with a used exposure mode, the stepping is effected in a direction having a shorter moving distance, whereby there is an advantage that the stepping time can be shortened.

When a plurality of optical integrators are replaceably provided in the illumination optical system and these optical integrators are switched to be used in accordance with the exposure mode, even if an exposure mode is changed and the size of the exposure region on the photosensitive substrate is changed, deterioration in the illumination efficiency can be prevented.

It is still another object of the present invention to increase the size of an exposure field which can be transferred by one scan by using a projection optical system having a circular image field and utilizing a rectangular or slit-like region projecting along the diameter within said circular image field.

It is still another object of the present invention to control one or both of a first light-shielding means (shutter) which is disposed between a light source and a secondary light source generating means and a second light-shielding means (movable blade) which is disposed between the secondary light source generating means and a condensing optical system in cooperation in accordance with a sequence of the scan-exposure.

It is still another object of the present invention to accurately correct a relative rotational error (yawing) generated during a relative movement between the mask and the photosensitive substrate to improve the quality of an image which is projected onto the photosensitive substrate, as well as to improve an overlap accuracy between a pattern region formed on the photosensitive substrate and projected images of the mask patterns.

BRIEF DESCRIPTION OF THE DRAWINGS

Other objects and advantages of the present invention will become apparent during the following discussion in conjunction with the accompanying drawings, in which:

FIG. 14 is a graph showing a relation of a throughput with respect to a sensitivity of a photoresist in the fourth embodiment;

DETAILED DESCRIPTION OF THE PREFERRED EMBODIMENTS

Figure 1:
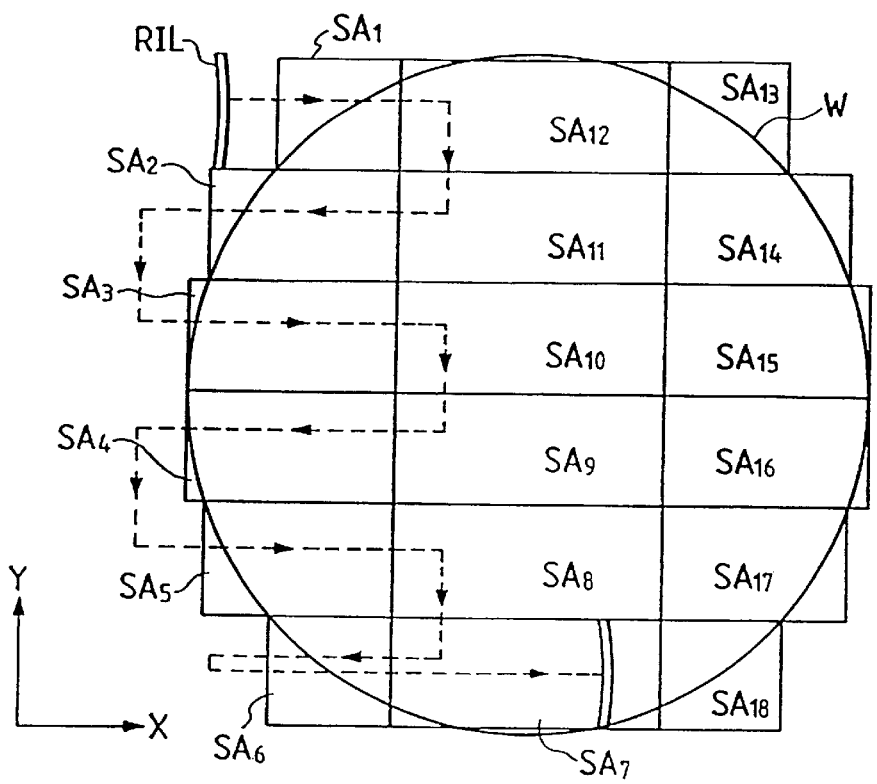
FIG. 1 is an explanatory view showing a concept of a conventional step & scan exposure method using a beam of arched slit illumination light.
Figure 2A:
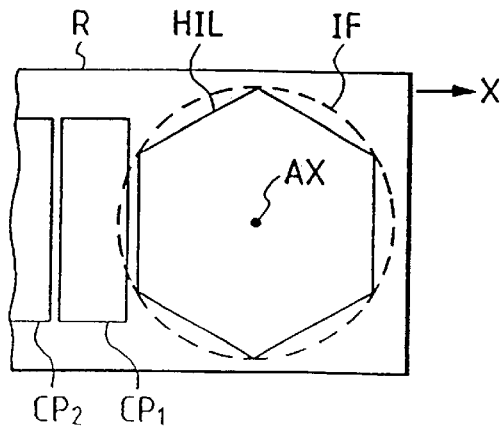
FIGS. 2A and 2B are explanatory views showing a conventional scan-exposure method employing a beam of regular hexagonal illumination light.
Figure 2B:
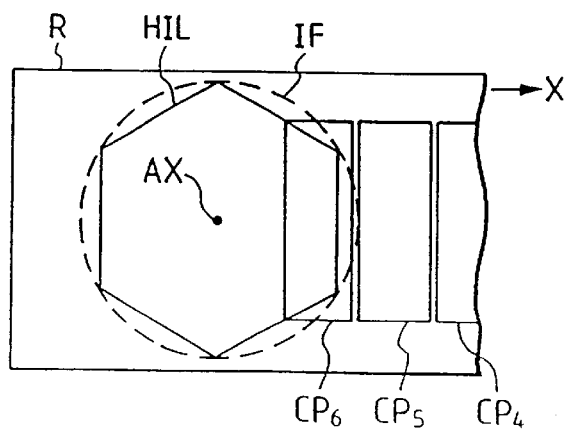
Figure 3:
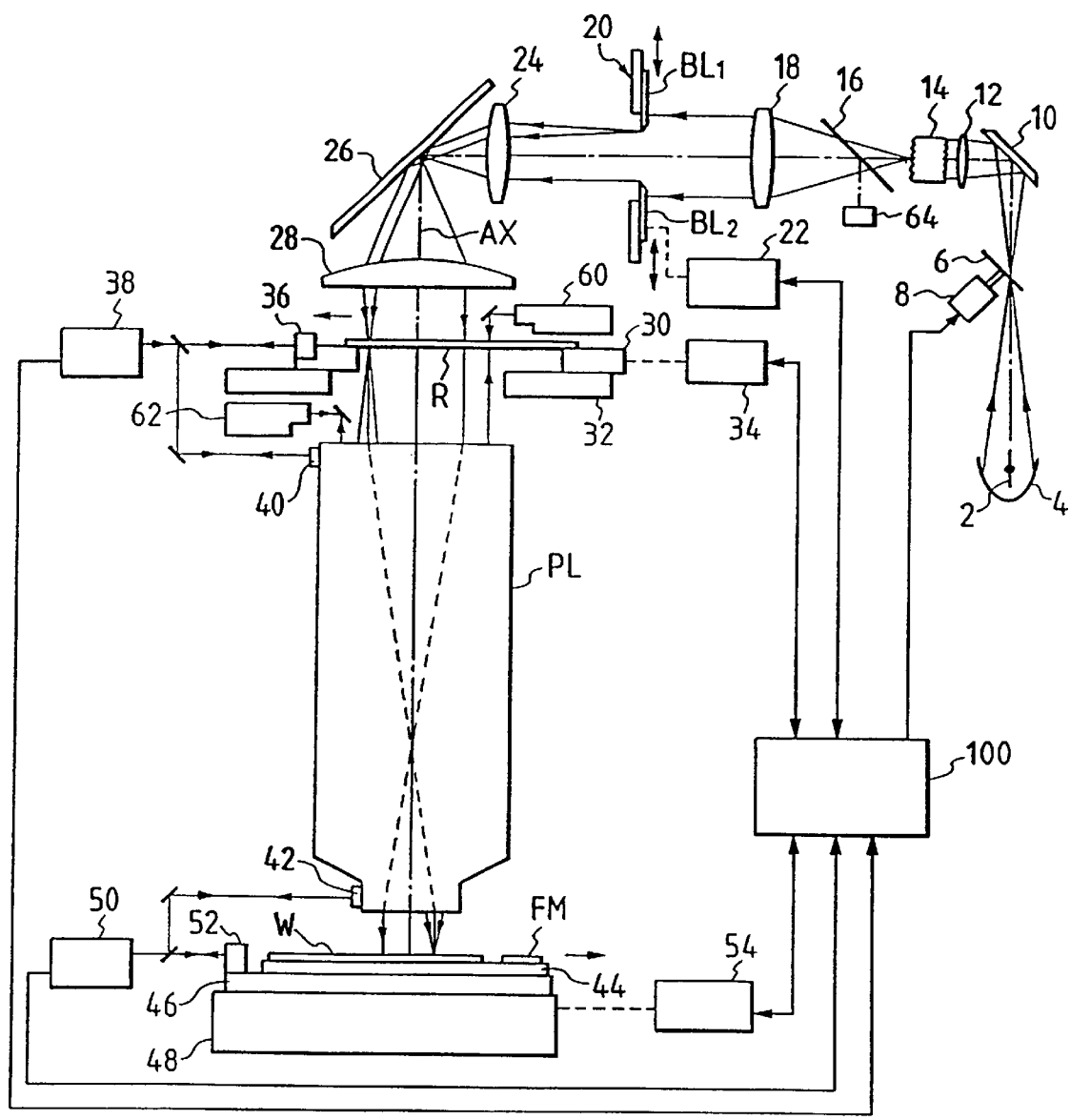
FIG. 3 is a view illustrating a construction of a projection exposure apparatus in an embodiment of this invention.

FIG. 3 illustrates a construction of a projection exposure apparatus in a first embodiment of this invention. This embodiment involves the use of a projection optical system (hereinafter simply termed a projection lens for simplicity) PL constructed of only a 1/5 reduction refractive element which is telecentric on both sides or of a combination of the refractive element and a reflex element.

Figure 4:
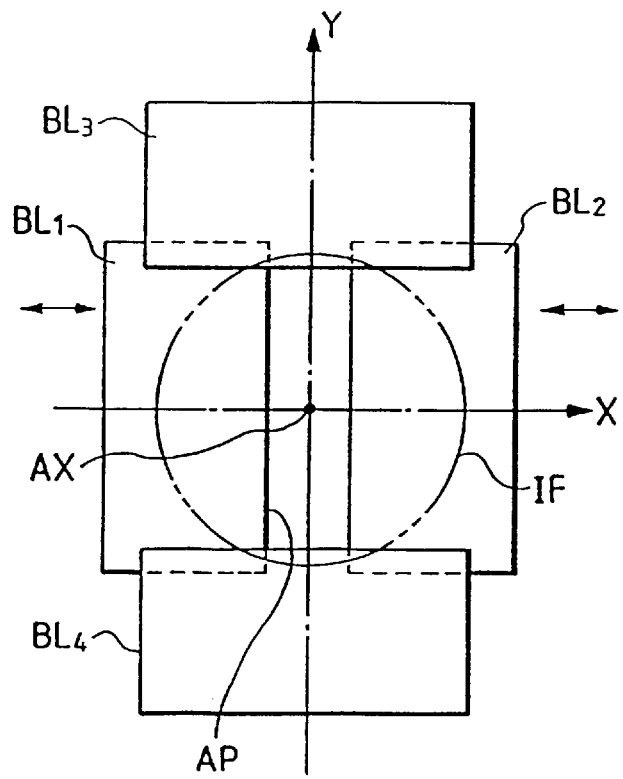
FIG. 4 is a plan view illustrating shapes of blades of a blind mechanism.

Exposure illumination light emitted from a mercury lamp 2 is condensed at a second focal point through an elliptical mirror 4. Disposed at this second focal point is a rotary shutter 6 for switching over a cut-off and a transmission of the illumination light with the aid of a motor 8. The exposure the illumination light passing through the shutter 6 is reflected by a mirror 10. The illumination light beam is then incident on a fly eye lens system 14 via an input lens 12. A multiplicity of secondary light source images are formed on the outgoing side of the fly eye lens system 14. The illumination light beam from each of the secondary light source images falls on a lens system (condenser lens) 18 via a beam splitter 16. Movable blades $BL_1$, $BL_2$, $BL_3$, $BL_4$ of a blind mechanism 20 are, as illustrated in FIG. 4, arranged on a rear focal plane of the lens system 18. Four pieces of blades $BL_1$, $BL_2$, $BL_3$, $BL_4$ are individually independently moved by a driving system 22. In accordance with this embodiment, an X-directional (scan-exposure direction) width of an aperture AP is determined by edges of the blades $BL_1$, $BL_2$. A Y-directional (stepping direction) length of the aperture AP is determined by the edges of the blades $BL_3$, $BL_4$.

Further, a shape of the aperture AP defined by the respective edges of the four blades $BL_1$–$BL_4$ is so determined as to be embraced by a circular image field IF of the projection lens PL. Now, the illumination light has a uniform distribution of illuminance in a position of the blind mechanism 20. A reticle R is irradiated with the illumination light via a lens system 24, a mirror 26 and a main condenser lens 28 after passing through the aperture AP of the blind mechanism 20. At this time, an image of the aperture AP defined by the four blades $BL_1$–$BL_4$ of the blind mechanism 20 is formed on a pattern surface of the underside of the reticle R. Note that an arbitrary image forming magnification can be given by the lens system 24 in combination with the condenser lens 28. Herein, however, it is assumed that an approximately 2-fold enlarged image of the aperture AP of the blind mechanism 20 is projected on the reticle R. Hence, an X-directional moving velocity Vbl of the blades $BL_1$, $BL_2$ may be set to Vrs/2 in order to make a scan velocity Vrs of the reticle R during a scan exposure coincident with a moving velocity of an edge image of the blades $BL_1$, $BL_2$ of the blind mechanism 20 which is projected on the reticle R.

Now, the reticle R undergoing the illumination light defined by the aperture AP is held on a reticle stage 30 movable at an equal velocity at least in the X-direction on a column 32. The column 32 is integral with, though not illustrated, a column for fixing a lens barrel for the projection lens PL. The reticle stage 30 performs a microscopic rotational movement for a yawing correction and a one-dimensional scan movement in the X-direction with the aid of a driving system 34. A movable mirror 36 for reflecting a length measuring beam emitted from a laser interferometer 38 is fixed to one end of the reticle stage 30. An X-directional position of the reticle R and a yawing quantity are measured in real time by the laser interferometer 38. Note that a fixed mirror (reference mirror) 40 for the laser interferometer 38 is fixed to an upper edge of the lens barrel for the projection lens PL. A pattern image formed on the reticle R is reduced by a factor of 5 through the projection lens PL and formed on a wafer W. The wafer W is held together with a fiducial mark plate FM by means of a wafer holder 44 capable of making a microscopic rotation. The holder 44 is installed on a Z stage 46 capable of effecting a micromotion in the (Z-) direction of an optical axis AX of the projection lens PL. Then, the Z stage 46 is installed on an XY stage 48 moving two-dimensionally in X- and Y-directions. This XY stage 48 is driven by a driving system 54. Further, a yawing quantity and a coordinate position of the XY stage 48 are measured by a laser interferometer 50. A fixed mirror 42 for the laser interferometer 50 is fixed to a lower edge of the lens barrel for the projection lens PL. A movable mirror 52 is fixed to one edge of the Z stage 46.

In accordance with this embodiment, the projection magnification is set to 1/5. Therefore, during the scan exposure an X-directional moving velocity Vws of the XY stage 48 is 1/5 of the velocity Vrs of the reticle stage 30. Provided further in this embodiment is an alignment system 60, based on a TTR (through the reticle) method, for detecting an alignment mark (or a fiducial mark FM) on the wafer W through the projection lens PL as well as through the reticle R. Provided also is an alignment system 62, based on a TTL (through the lens) method, for detecting the alignment mark (or the fiducial mark FM) on the wafer W through the projection lens PL from a space under the reticle R. A relative alignment between the reticle R and the wafer W is conducted before a start of an S & S exposure or during the scan exposure.

Further, a photoelectric sensor 64 shown in FIG. 3, when the fiducial mark FM is formed as a luminescent type, receives the light from this luminescent mark via the projection lens PL, the reticle R, the condenser lens 28, the lens systems 24, 18 and the beam splitter 16. The photoelectric sensor 64 is employed when determining a position of the reticle R in a coordinate system of the XY stage 48 or when determining a detection central position of each of the alignment systems 60, 62. By the way, the aperture AP of the blind mechanism 20 is elongated as much as possible in the Y-direction orthogonal to the scan direction (X-direction), thereby making it possible to decrease the number of the X-directional scanning actions, or in other terms, the number of Y-directional stepping actions of the wafer W. In some cases, however, the Y-directional length of the aperture AP may be varied by the respective edges of the blades $BL_3$, $BL_4$ depending on sizes, shapes and an arrangement of chip patterns on the reticle R. An adjustment may be made so that the face-to-face edges of the blades, e.g., $BL_3$, $BL_4$ are aligned with street lines for defining a shot region on the wafer W. With this adjustment, a correspondence to a variation in the Y-directional size of the shot region can be easily obtained.

Further, if the Y-directional dimension of one shot region is not smaller than the Y-directional maximum dimension of the aperture AP, as disclosed in preceding Japanese Patent Laid-open Application No. 2-229423, it is required that an exposure quantity be brought into a seamless state by effecting an overlap exposure inwardly of the shot region. A method in this instance will be explained in greater detail.

Next, the operation of the apparatus in this embodiment will be discussed. A sequence and control thereof are managed in a generalizable manner by a main control unit 100. The basic action of the main control unit 100 lies in causing relative movements of the reticle stage 30 and the XY stage 48 keeping a predetermined velocity ratio during the scan exposure while retaining a relative positional relationship between the reticle pattern and the wafer pattern within a predetermined alignment error. These relative movements are effected based on inputting of velocity information given from tacho-generators in the driving systems 34, 54 as well as on inputting of yawing and positional information from the laser interferometers 38, 50.

Then, the main control unit 100 in this embodiment is remarkably characterized, in addition to its operation, by interlock-controlling the driving system 22 so that scan-directional edge positions of the blades $BL_1$, $BL_2$ of the blind mechanism 20 are shifted in the X-direction in synchronization with scanning of the reticle stage 30.

Note that if the illumination quantity during the scan exposure is fixed, the absolute velocities of the reticle stage 30 and of the XY stage 48 have to be increased according as the scan-directional maximum opening width of the aperture AP becomes larger. In principle, when the same exposure quantity (dose amount) is given to a resist on the wafer, and if the width of the aperture AP is doubled, the velocities of the XY stage 48 and the reticle stage 30 have to also be doubled.

Figure 5:
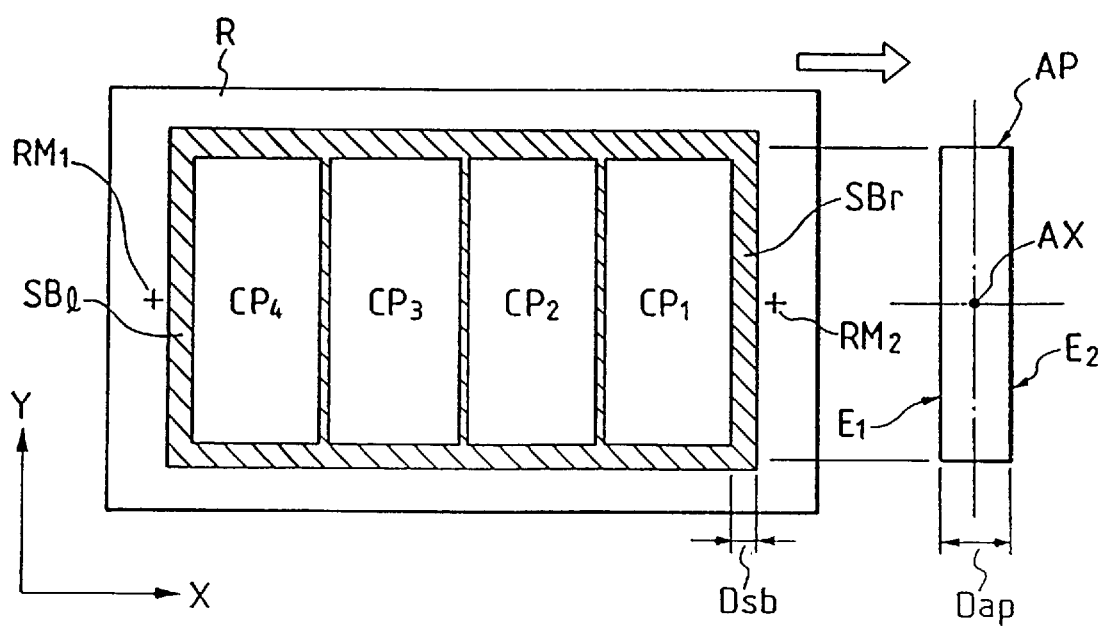
FIG. 5 is a plan view showing a pattern layout of a reticle which is suitable for the apparatus of FIG. 3.

FIG. 5 shows a relationship in layout between the reticle R mountable on the apparatus illustrated in FIG. 3 and the aperture AP of the blind mechanism 20. It is herein assumed that four pieces of chip patterns $CP_1$, $CP_2$, $CP_3$, $CP_4$ are arranged in the scan direction on the reticle R. The respective chip patterns are sectioned by light shielding bands corresponding to the street lines. A periphery of an aggregated region (shot region) of the four chip patterns is surrounded with a light shielding band having a width Dsb larger than the street line.

Let herein SBl, SBr be the right and left light shielding bands extending along the periphery of the shot region on the reticle R. It is also presumed that reticle alignment marks $RM_1$, $RM_2$ be formed externally of these light shielding bands.

The aperture AP of the blind mechanism 20 also includes edges $E_1$, $E_2$ of the blades $BL_1$, $BL_2$ which extend in parallel to the Y-direction orthogonal to the scan direction (X-direction). Let Dap be the scan-directional width of these edges $E_1$, $E_2$. Further, a Y-directional length of the aperture AP is substantially equal to a Y-directional width of the shot region on the reticle R. The blades $BL_3$, $BL_4$ are so set that the edges for defining the longitudinal direction of the aperture AP coincide with the center of the peripheral light shielding band extending in the X-direction.

The following is an explanation of how an S & S exposure is conducted in this embodiment with reference to FIGS. 6A–6E. The premise herein is such that the reticle R and the wafer W shown in FIG. 5 are relatively aligned by use of the alignment systems 60, 62 and the photoelectric sensor 64. Incidentally, FIGS. 6A–6E each sketch a profile of the reticle R shown in FIG. 5. For facilitating the understanding of motions of the blades $BL_1$, $BL_2$ of the blind mechanism 20, the blades $BL_1$, $BL_2$ are herein illustrated just above the reticle R.

Figure 6A:
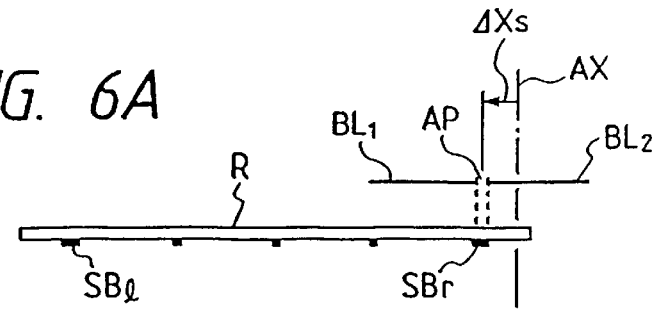
FIGS. 6A–6E are explanatory views showing scan-exposure processes in the embodiment of this invention.

To start with, as illustrated in FIG. 6A, the reticle R is set at a start-of-scan point in the X-direction. Similarly, one corresponding shot region on the wafer W is set at the start of the X-directional scan.

At this time, an image of the aperture AP through which the reticle R is illuminated has a width Dap that is ideally zero. It is, however, difficult to make the width completely zero, depending on the conditions where the edges $E_1$, $E_2$ of the blades $BL_1$, $BL_2$ are configured. Then, in accordance with this embodiment, the width Dap of the image of the aperture AP on the reticle is smaller to some extent than the width Dsb of the light shielding band SBr on the right side of the reticle R. Generally, the width Dsb of the light shielding band SBr is on the order of 4–6 mm, while the width Dap of the image of the aperture AP on the reticle may be set to about 1 mm.

Then, as shown in FIG. 6A, the X-directional center of the aperture AP is arranged to deviate by ΔXs from the optical axis AX in a direction (left side in the same Figure) opposite to the scan advancing direction of the reticle R. This distance ΔXs is set to approximately one-half of the maximum opening width Dap of the aperture AP with respect to this reticle R. Explaining it more specifically, the longitudinal dimension of the aperture AP is determined automatically by the Y-directional width of the shot region of the reticle R. Hence, a maximum value DAmax of the X-directional width Dap of the aperture AP is also determined by a diameter of the image field IF. The maximum value thereof is previously calculated by the main control unit 100. Further, the distance ΔXs is determined to satisfy strictly a relationship such as DAmin+2•ΔXs=DAmax, where Dmin is the width (minimum) of the aperture AP at the start-of-scan point shown in FIG. 6A.

Figure 6B:
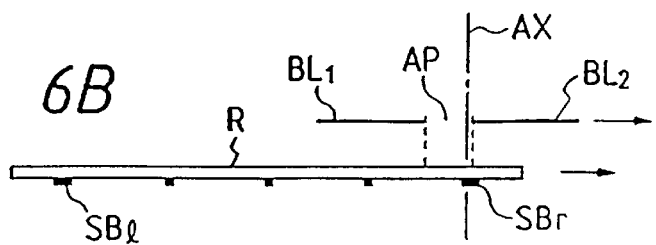

Next, the reticle stage 30 and the XY stage 48 are moved in the directions reverse to each other at a velocity ratio proportional to the projection magnification. At this time, as illustrated in FIG. 6B, only the blade $BL_2$ located in the advancing direction of the reticle R in the blind mechanism 20 is moved in synchronization with the movement of the reticle R so that an image of the edge $E_2$ of the blade $BL_2$ exists on the light shielding band-SBr.

Figure 6C:
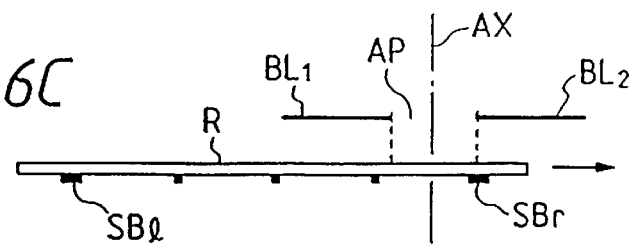

Then, the scan of the reticle R proceeds, and the edge $E_2$ of the blade $BL_2$ reaches, as shown in FIG. 6C, a position to determine the maximum opening width of the aperture AP. Thereafter, the movement of the blade $BL_2$ is halted. The driving system 22 for the blind mechanism 20 therefore incorporates a tacho-generator and an encoder for monitoring both a moving quantity and a moving velocity of each blade. Pieces of positional and velocity information given therefrom are transmitted to the main control unit 100 and employed for the synchronization with the scanning motion of the reticle stage 30.

Figure 6D:
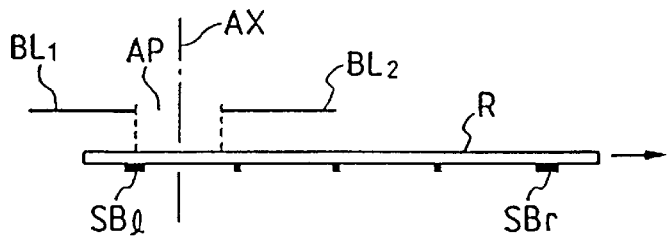
Figure 6E:
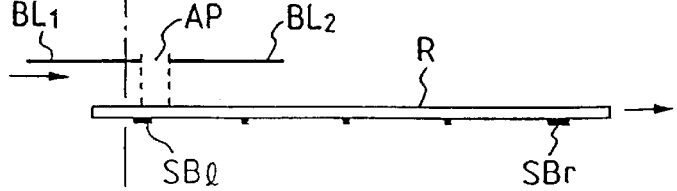

Thus, the reticle R is sent in the X-direction at a constant velocity up to a position shown in FIG. 6D while being irradiated with the illumination light passing through the aperture AP having the maximum width. That is, the image of the edge $E_1$ of the blade $BL_1$ located in the direction opposite to the-advancing direction of the reticle R is, as depicted in FIG. 6E, run in the same direction in synchronization with the moving velocity from the time when the image of the edge $E_1$ of the blade $BL_1$ reaches the light shielding band SBl on the left side of the shot region of the reticle R.

Then, when the left light shielding band SBl is intercepted by the edge image of the right blade $BL_2$ (at this moment, the left blade $BL_1$ also comes, and the width Dap of the aperture AP becomes the minimum value DAmin), the movements of the reticle stage 30 and the blade $BL_1$ are stopped.

With the actions described above, the exposure (for one shot) by one-scan of the reticle comes to an end, and the shutter is closed. However, if the width Dap of the aperture AP is well smaller than the width Dsb of the light shielding band SBl (or SBr) in that position, and when the illumination light leaking to the wafer W can be made zero, the shutter 6 may remain opened.

Next, the XY stage 48 is stepped in the Y-direction by one row of the shot regions. Scanning on the XY stage 48 and the reticle stage 30 is effected in a direction reverse to the direction set so far. The same scan-exposure is performed on a different shot region on the wafer W.

As discussed above, in accordance with this embodiment, the scan-directional stroke of the reticle stage 30 can be minimized. Besides, there is such an advantage that the light shielding bands SBl, SBr for defining the both sides of the shot region with respect to the scan direction may be small in terms of their widths Dsb.

Note that an unevenness in the exposure quantity in the scan direction is caused on the wafer W until the reticle stage 30 is accelerated from the state shown in FIG. 6A enough to reach a constant velocity scan.

For this reason, it is required that a prescan (prerunning) range be determined at the start of scanning until the state of FIG. 6A is obtained. In this case, it follows that the widths Dsb of the light shielding bands SBr, SBl are expanded corresponding to a length of the prescan. This is similarly applied to a case where an overscan is needed corresponding to the fact that the constant velocity motion of the reticle stage 30 (XY stage 48) can not be abruptly stopped when finishing one scan-exposure.

Also in the case of performing the prescan and the overscan, however, the shutter 6 is set at a high speed. If an open response time (needed for bringing the shutter from a full closing state to a full opening state) and a close response time are considerably short, and just when the reticle stage 30 enters a main scan (position in FIG. 6A) after a completion of the prescan (acceleration) or shifting from the main scan to an overrun (deceleration), the shutter may be opened and closed interlocking therewith.

A response time $t_s$ of the shutter 6 may satisfy the following relationship under a condition such as Dsb>DAmin:

$$(Dsb-DAmin)/Vrs>t_s$$

where Vrs (mm/sec) is the constant scan velocity during the main scan on, e.g., the reticle stage 30, Dsb (mm) is the width of each of the light shielding bands SBl, SBr, and DAmin (mm) is the minimum width of the aperture AP on the reticle R.

Further, according to the apparatus in this embodiment, the yawing quantities of the reticle stage 30 and of the XY stage 48 are measured independently by the laser interferometers 38, 50, respectively. A difference between the two yawing quantities is obtained by the main control unit 100. A trace amount of rotation of the reticle stage 30 or the wafer holder 44 may be caused during the scan-exposure so that the difference therebetween becomes zero. In this instance, however, it is necessary that a center of the microscopic rotation be always identical with the center of the aperture AP. Taking a structure of the apparatus into consideration, it is possible to readily actualize a method of causing the microscopic rotation of an X-directional guide portion of the reticle stage 30 about an optical axis AX.

Figure 7:
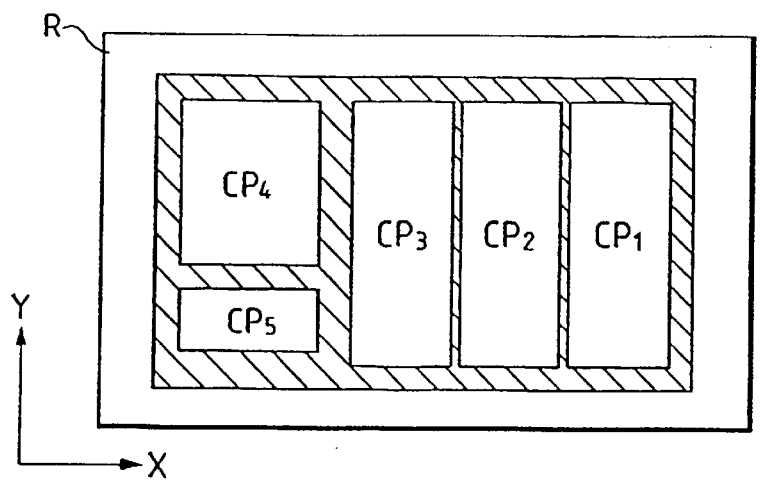
FIG. 7 is a plan view illustrating another pattern layout of the reticle mountable on the apparatus of FIG. 3.

FIG. 7 shows an example of another pattern layout of the reticle R mountable on the apparatus depicted in FIG. 3. The chip patterns $CP_1$, $CP_2$, $CP_3$ are employed for exposing the wafer by a step-and-scan (S & S) method using the illumination light coming from the slit aperture AP as in the case of the reticle R shown in FIG. 5. Further, other chip patterns $CP_4$, $CP_5$ formed on the same reticle R are employed for exposing the wafer by a step-and-repeat (S & R) method. This kind of proper use can be easily attained by setting the aperture AP with the aid of the blades $BL_1$–$BL_4$ of the blind mechanism 20. When exposing, e.g., the chip pattern $CP_4$, the reticle stage 30 is moved and set so that a center of the chip pattern $CP_4$ coincides with the optical axis AX. At the same time, the shape of the aperture AP may simply be matched with an external shape of the chip pattern $CP_4$. Then, only the XY stage 48 may be moved in a stepping mode. As discussed above, if the reticle pattern is set as shown in FIG. 7, the S & S exposure and the S & R exposure can be executed selectively by the same apparatus and, besides, done without replacing the reticle.

Figure 8:
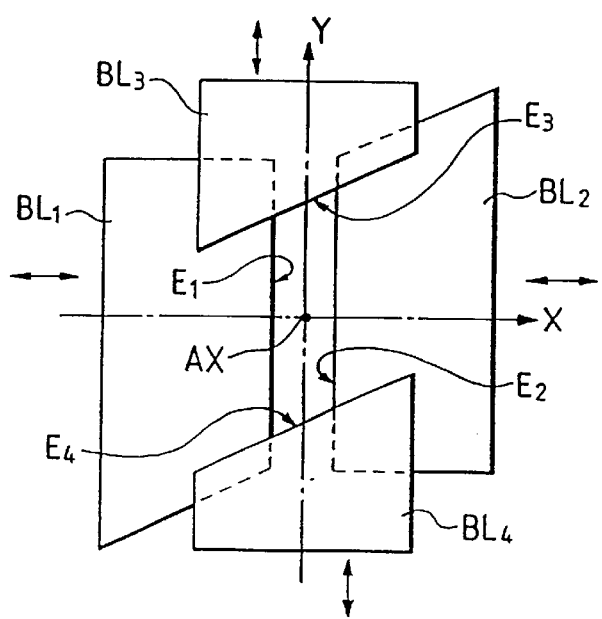
FIG. 8 is a plan view illustrating shapes of the blades of the blind mechanism in a second embodiment.

FIG. 8 illustrates one example of configurations of the blades $BL_1$–$BL_4$ of the blind mechanism 20 that correspond to a case where a size of the on-the-reticle chip pattern to be exposed in the (Y-) direction orthogonal to the scan direction increases with respect to the image field IF of the projection optical system. The edges $E_1$, $E_2$ for defining the scan-directional (X-directional) width of the aperture AP, as in the same way in FIG. 4 given above, extend in parallel in the Y-direction. The edges $E_3$, $E_4$ for determining the longitudinal direction of the aperture AP are parallel to each other but inclined to the X-axis. The aperture AP assumes a parallelogram. In this case, four pieces of blades $BL_1$–$BL_4$ move in the X- and Y-directions in interlock with the movement of the reticle during the scan exposure. An X-directional moving velocity Vbx of an image of each of the edges $E_1$, $E_2$ of the blades $BL_1$, $BL_2$ in the scan-exposure direction is, however, substantially the same as the scan velocity Vrs of the reticle. If there exists a necessity for moving the blades $BL_3$, $BL_4$, a Y-directional moving velocity Vby of each of the edges $E_3$, $E_4$ is required to synchronize with a relationship such as Vby=Vbx•tan θe, where θe is the inclined angle of each of the edges $E_3$, $E_4$ with respect to the X-axis.

FIGS. 9A–9F schematically illustrate a scan sequence during the S & S exposure in the case of an aperture shape shown in FIG. 8. Throughout FIGS. 9A–9F, it is assumed that the aperture AP is projected on the reticle R and defined by the respective edges $E_1$–$E_4$ thereof. In accordance with a second embodiment shown in FIGS. 8 and 9A–9F, a chip pattern region CP on the reticle R which is to be projected on the wafer W has, it is also presumed, a size that is approximately twice the longitudinal dimension of the aperture AP. The second embodiment therefore takes such a structure that the reticle stage 30 is stepped precisely in the Y-direction orthogonal to the scan direction.

Figure 9A:
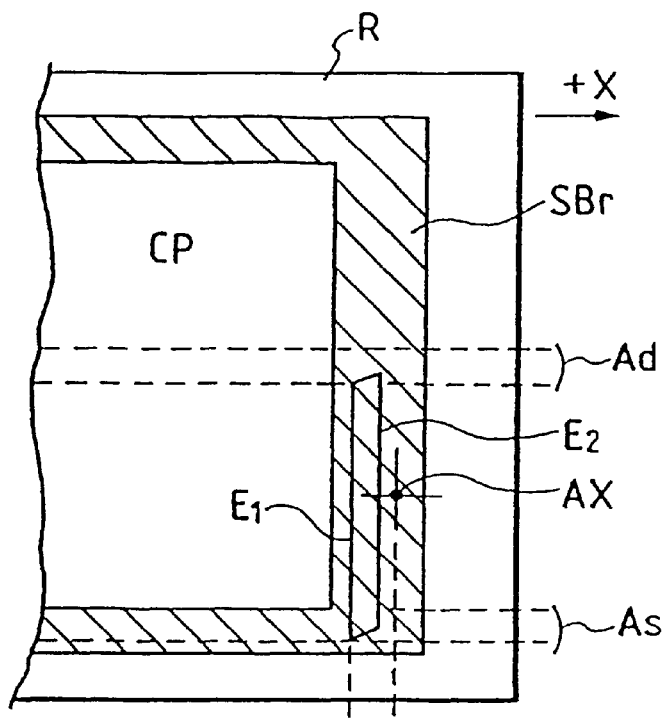
FIGS. 9A–9F are explanatory views showing a sequence of a step & scan exposure in the second embodiment.

At the first onset, the blades $BL_1$, $BL_2$ shown in FIG. 8 are adjusted and set as illustrated in FIG. 9A at the start of scanning.

More specifically, the aperture AP having a width narrowed most is positioned on the light shielding band SBr on the right side of the reticle R. Simultaneously, the left edge $E_1$ of the aperture AP is set in a position (edge position in which the aperture AP is expanded most in the X-direction) spaced most away from the optical axis AX. Further, throughout FIGS. 9A–9F, the exposure quantity for one scan-exposure lacks in subregions Ad, and As each extending beltwise in the scan direction (X-direction). These subregions Ad, As are formed because of the fact that the upper and lower edges $E_3$, $E_4$ of the aperture AP are inclined to the X-axis. A Y-directional width of each of the subregions Ad, As is univocally determined such as DAmax•tan θe, where θe is the inclined angle of each of the edges $E_3$, $E_4$, and DAmax is the maximum aperture width defined by the edges $E_1$, $E_2$. The scan-exposure is conducted while overlapping triangular areas shaped by the edges $E_3$, $E_4$ of the aperture AP in the Y-direction with respect to the subregion Ad of the subregions Ad, As with this unevenness in terms of the exposure quantity that are set in the pattern region CP. An attempt to make the exposure quantity uniform is thus made. Further, in connection with the other subregion As, this subregion is matched exactly with the light shielding band on the reticle R.

Figure 9B:
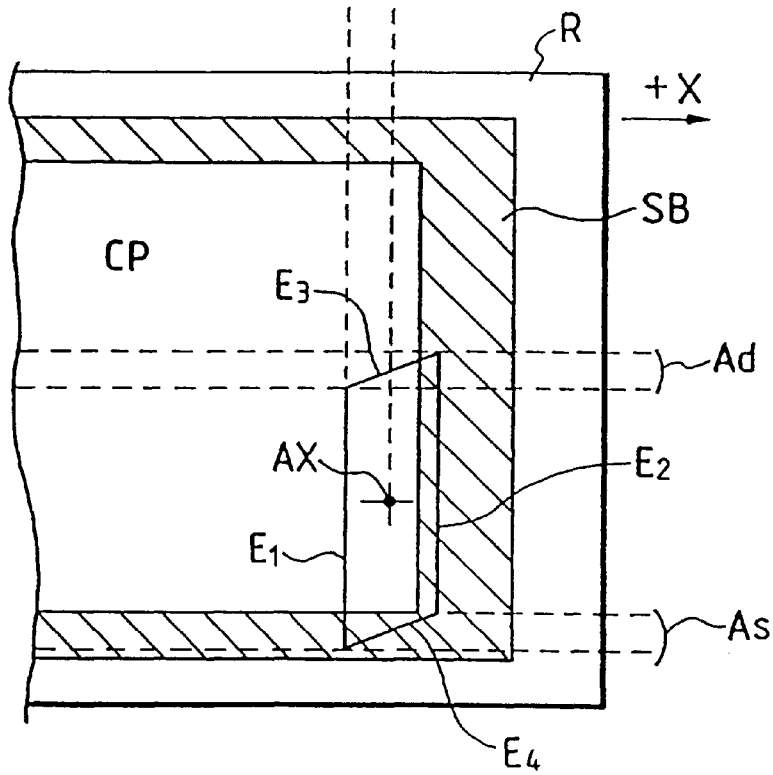

Now, the reticle R and the edge $E_2$ (blade $BL_2$) are made to run substantially at the same velocity in a +X-direction (right in the same Figure) from the state shown in FIG. 9A. Eventually, as depicted in FIG. 9B, the X-directional width of the aperture AP is maximized, and the movement of the edge $E_2$ is also halted. In this state shown in FIG. 9B, the center of the aperture AP substantially coincides with the optical axis AX.

Figure 9C:
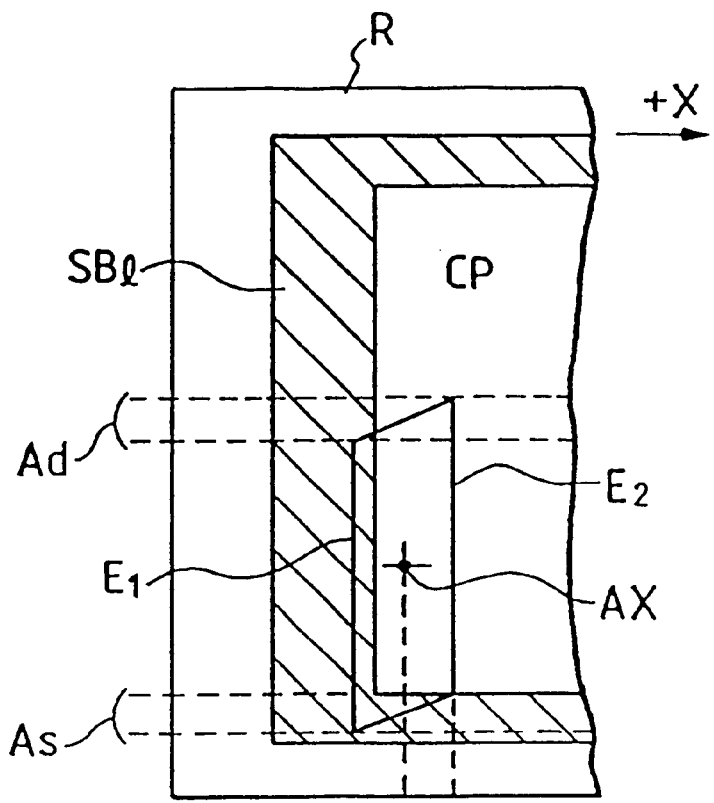
Figure 9D:
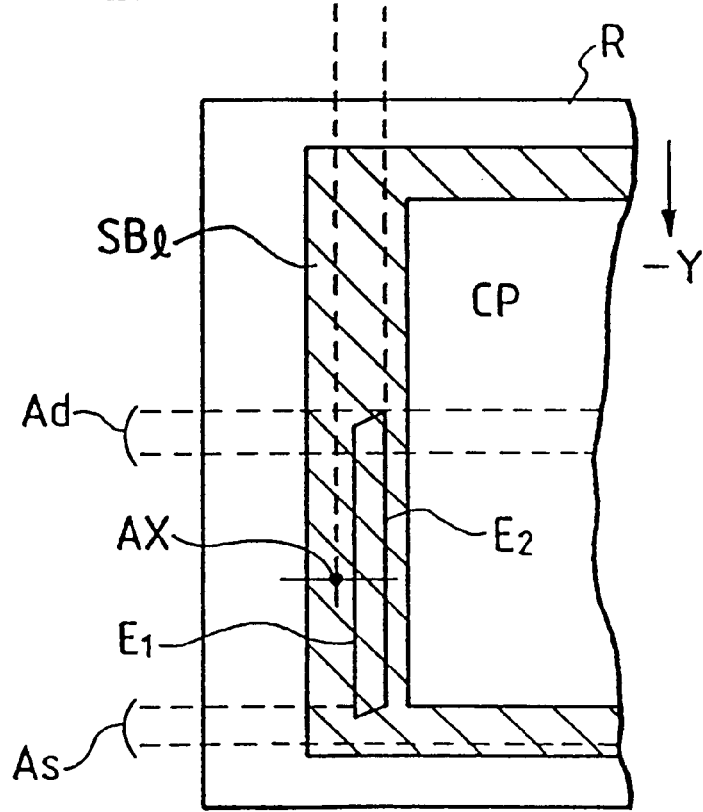

Thereafter, only the reticle R moves at the constant velocity in the +X-direction. As illustrated in FIG. 9C, the edge $E_1$ (blade BLOW) and the reticle R move rightward (in the +X-direction) substantially at the same velocity from the time when the left edge $E_1$ of the aperture AP enters the left light shielding band SBl. Approximately a lower half of the chip pattern region CP is thus exposed. The reticle R and the aperture AP are stopped in a state shown in FIG. 9D.

Figure 9E:
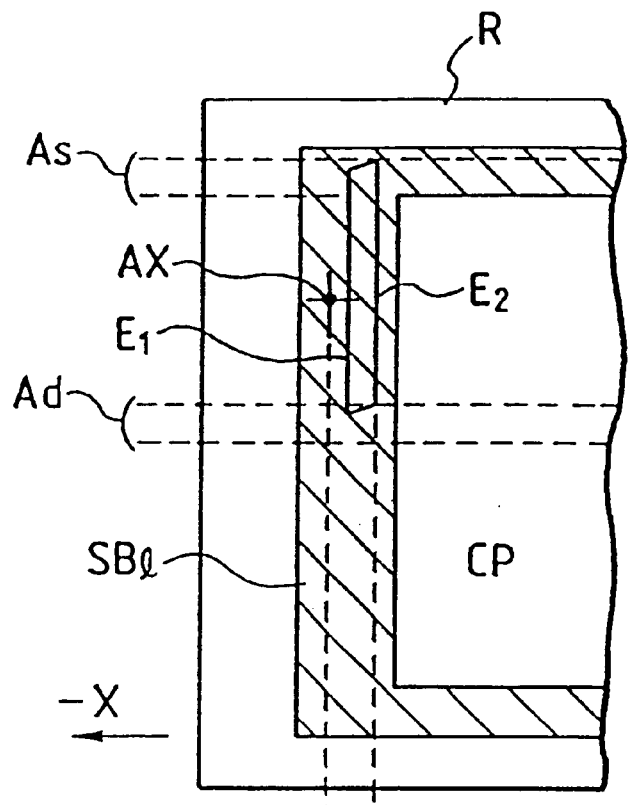

Next, the reticle R is stepped precisely by a fixed quantity in a −Y-direction. The wafer W is similarly stepped in a +Y-direction. Then, a state shown in FIG. 9E is developed. At this time, a relative positional relationship in the Y-direction is so set that the overlapped subregion Ad undergoes an overlap exposure at the triangular area defined by the edge $E_4$. Additionally, on this occasion, if it is required that the Y-directional length of the aperture AP be varied, a movement of the edge $E_3$ (blade $BL_3$) or $E_4$ (blade $BL_4$) is controlled in the Y-direction.

Figure 9F:
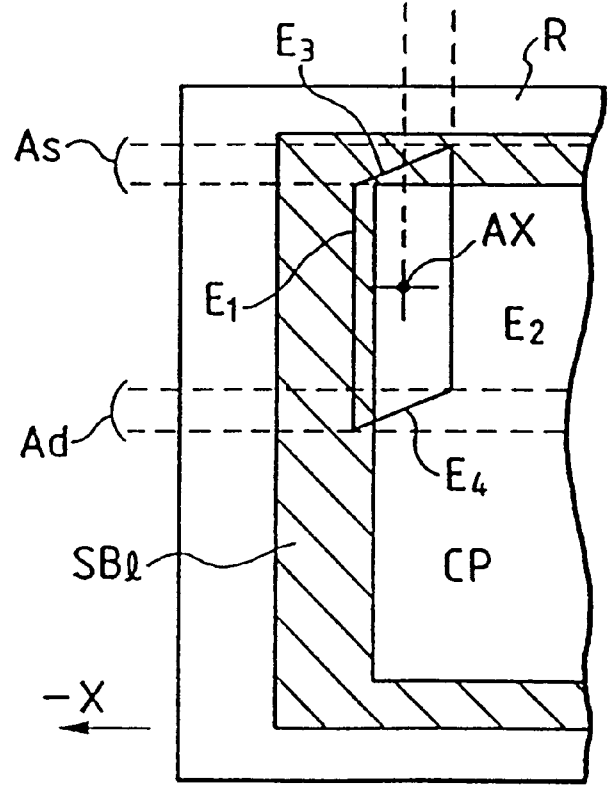

Next, the reticle R is scan-moved in a −X-direction, and simultaneously the edge $E_1$ (blade $BL_1$) is moved in the −X-direction in interlock therewith. Then, as shown in FIG. 9F, when the aperture width defined by the edges $E_1$, $E_2$ comes to the maximum, the movement of the edge $E_1$ is stopped. Only the reticle R continuously moves at the constant velocity in the −X-direction.

With the actions described above, it is possible to expose, on the wafer W, the chip pattern region CP equal to or larger than the Y-directional dimension of the image field of the projection optical system. Besides, the overlapped subregion Ad is set. The two edge subregions (triangular areas) undergo the overlap exposure by two scan-exposing processes, wherein the exposure quantity lacks depending on the shape of the aperture AP by one scan-exposing process. The exposure quantity within the subregion Ad is also made uniform (seamless).

Figure 10:
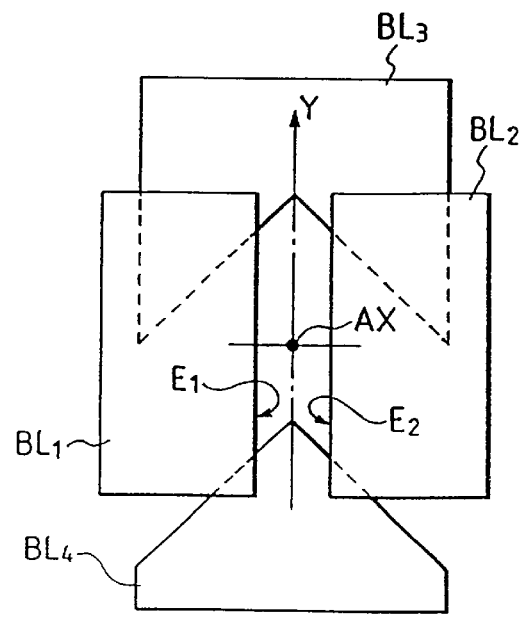
FIG. 10 is a plan view illustrating other shapes of the blades.

FIG. 10 sketches other blade configurations of the blind mechanism 20. The edges $E_1$, $E_2$ of the blades $BL_1$, $BL_2$ which determine the scan direction are conceived as straight lines parallel to each other. The edges of the blades $BL_3$, $BL_4$ extending in the direction orthogonal to the scan-direction take triangles that are symmetric with respect to the Y-axis passing through the optical axis AX. Then, the edges of the blades $BL_3$, $BL_4$ herein assume, when approaching each other in the Y-direction, complementary shapes capable of substantially completely intercepting the light. Accordingly, the aperture AP may take a so-called chevron shape. In the case of such a chevron shape also, the uniformness can be similarly attained by executing the overlap exposure on the triangular areas at both ends.

Figure 11:
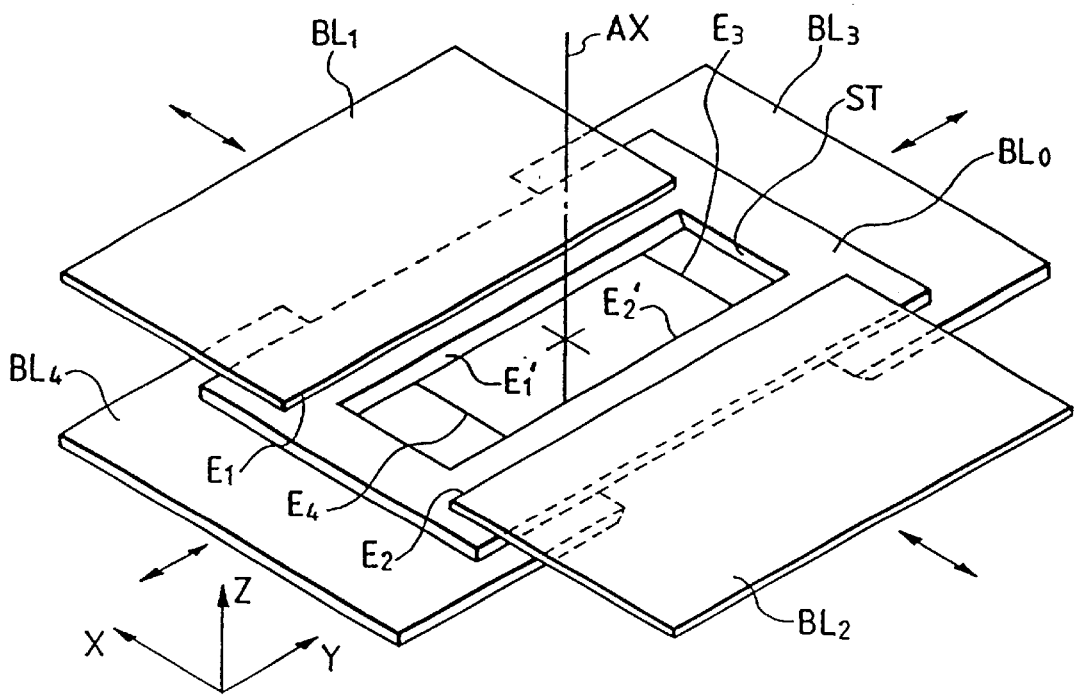
FIG. 11 is a perspective view illustrating a structure of the blind mechanism in a third embodiment.

Next, the blade configurations and the operation in accordance with a third embodiment of this invention will be explained with reference to FIGS. 11 and 12. Provided herein, as shown in FIG. 11, is a fixed blade $BL_0$ formed with a rectangular aperture ST having a fixed width in the scan-exposure direction (X-direction). The rectangular aperture ST includes two parallel edges $E_1'$, $E_2'$ for defining its X-directional width. The rectangular aperture ST is formed as a rectangle elongated in the Y-direction on the whole. The illumination region in the longitudinal direction is defined by the respective edges $E_3$, $E_4$ of the blades $BL_3$, $BL_4$ disposed on the lower surface of the fixed blade $BL_0$ and one-dimensionally moving in the Y-direction. Hence, the aperture AP is defined by the four edges $E_1'$, $E_2'$, $E_3$, $E_4$.

Disposed further on the upper surface of the fixed blade $BL_0$ are the blades $BL_1$, $BL_2$ moving in the X-direction in interlock (synchronization) therewith at the start or end of movement of the reticle R. In accordance with this embodiment the edges $E_1$, $E_2$ of the blades $BL_1$, $BL_2$ do not, unlike each of the preceding embodiments, serve as those for defining a range where an interior of the chip pattern region of the reticle R is illuminated during the scan-exposure. These edges $E_1$, $E_2$ function simply as a shutter. Therefore, the blades $BL_1$, $BL_2$ may be constructed to move at a high velocity with more reduction in weight than that of other blades $BL_3$, $BL_4$.

Figure 12:
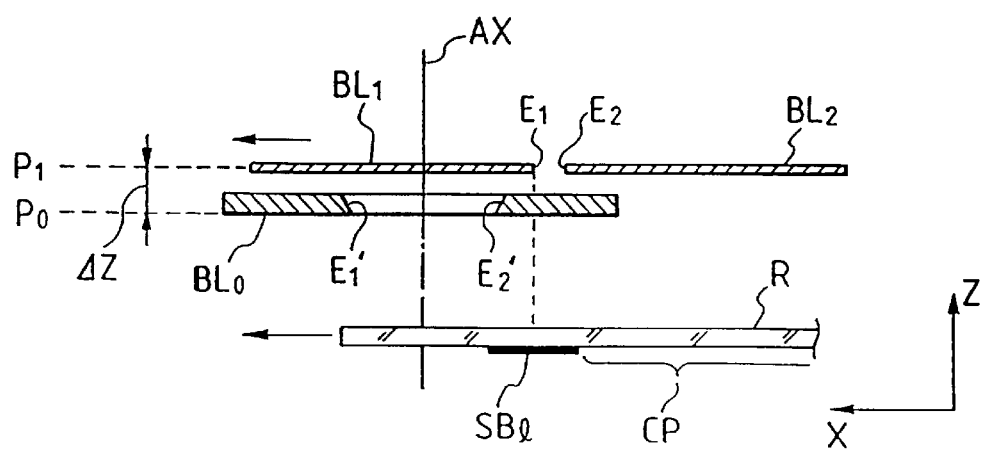
FIG. 12 is an explanatory view showing how the blind mechanism operates.

FIG. 12 schematically showing a relationship of the reticle R versus the blades $BL_1$, $BL_2$ and the fixed blade $BL_0$ that are shown in X-Z section. It is herein assumed that the reticle R moves from left to right, and the scan-exposure is then effected. Further, in this embodiment, the edges $E_1'$, $E_2'$ of the fixed blade $BL_0$ and the respective edges $E_3$, $E_4$ of the blades $BL_3$, $BL_4$ are located on a plane $P_0$ conjugate to the pattern surface of the reticle R. The blades $BL_1$, $BL_2$ serving as a shutter are, it is presumed, located on a plane $P_1$ spaced by $\Delta Z$ away from the plane $P_0$ in the direction of the optical axis AX.

Now, the edge $E_1$ of the left blade $BL_1$ is, as shown in FIG. 12, located more rightward than the edge $E_2'$ of the fixed blade $BL_0$ to completely shield the aperture AP from the light until the left light shielding band SBl on the reticle R reaches the right edge $E_2'$ partly configuring the aperture AP since the scan of the reticle R (wafer W) has been started. Then, a portion in the vicinity of the X-directional mid-point of the light shielding band SBl reaches a position corresponding to the edge $E_1$ of the blade $BL_1$. Hereafter, the blade $BL_1$ moves leftward at a velocity corresponding to the moving velocity of the reticle R so that the edge $E_1$ follows up the light shielding band SBl. The edge $E_1$ of the blade $BL_1$ is thus located more leftward by a given quantity than the left edge $E^{1'}$ of the fixed blade $BL_0$ (the aperture AP is fully opened). Just at this moment, the movement of the blade $BL_1$ is halted. At the end of the scan-exposure, the right blade $BL_2$ moves so that the edge $E_2$ of the blade $BL_2$ tracks the light shielding band SBr on the-right side of the reticle R. Eventually, the blade $BL_2$ completely shields the aperture AP from the light.

In accordance with the embodiments discussed above, the edges $E_1$, $E_2$ of the blades $BL_1$, $BL_2$ functioning as the shutter are always projected in a defocus state on the light shielding band SBl or SBr but not projected within the chip pattern region at all.

By the way, when effecting the scan-exposure by means of a pulse light source such as an excimer laser, etc., it follows that a pulse light emission takes place every time the reticle R (wafer W) moves a given distance (a value well smaller than the X-directional width of the aperture AP). In this instance, it is desirable that the projection image, on the reticle R, of-the edges $E_1'$, $E_2'$ of the aperture AP which define the scan-directional width would rather lack in sharpness. Namely, it may be preferable that the edges $E_1$, $E_2'$ deviate from the plane $P_0$.

On the other hand, the edges $E_1$, $E_2$ of the blades $BL_1$, $BL_2$ functioning as the shutter give an unnecessary light quantity to the exteriors of the light shielding bands, depending on the defocus quantity thereof, if the scan-directional width of each of the light shielding bands SBl, SBr is small. It is therefore desirable that the edges $E_1$, $E_2$ of the blades $BL_1$, $BL_2$ would rather be projected on the reticle R-as a sharp image. Thereupon, paying attention to FIG. 12, the plane $P_1$ may be conjugate to the pattern surface of the reticle R, while the plane $P_0$ may be shifted to a defocus position.

Figure 13:
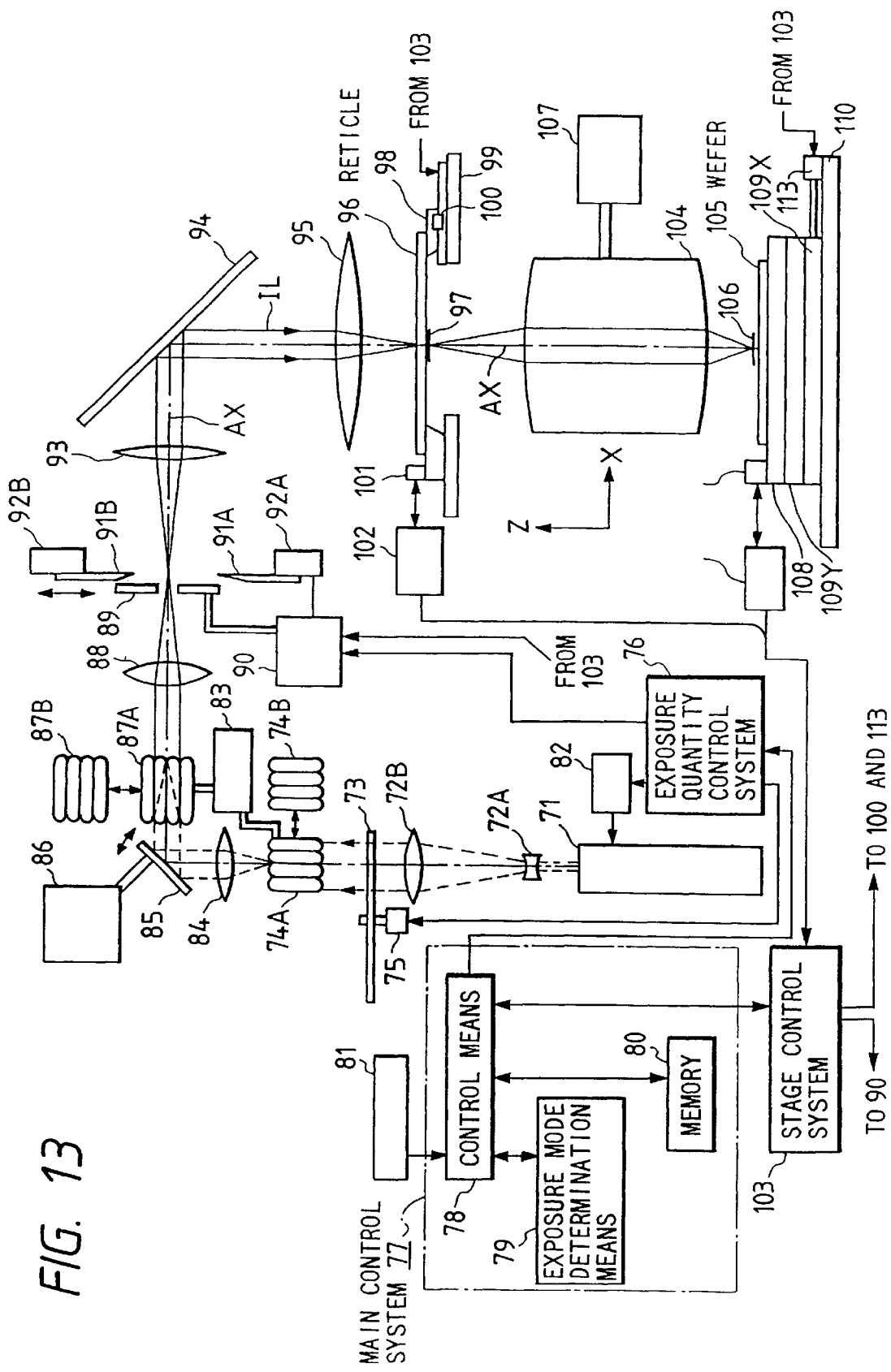
FIG. 13 is a view showing a construction of a projection exposure apparatus in a fourth embodiment of the present invention.

FIG. 13 is a view showing a construction of an apparatus for explaining a fourth embodiment of the present invention.

FIG. 13 shows a projection exposure apparatus in the fourth embodiment. Referring to FIG. 13, a cross-sectional form of a laser beam emitted from an excimer laser source such as an ArF excimer laser, or a KrF excimer laser, or a pulse laser source 71 such as a harmonics generating apparatus of a YAG laser is expanded by a laser expander consisting of lenses 72A and 72B. This laser beam passes through a light quantity variable filter plate 73 and falls on a fly eye lens 74A of a first group. The light quantity variable filter plate 73 is comprised of a plurality of light quantity attenuating filters which has a permeability varying stepwise on the circumference of a rotary plate thereof. It is possible to attenuate a quantity of the emitted laser beams by rotating the light quantity variable filter plate 73 through a driving motor 75. The driving motor 75 is controlled by an exposure quantity control system 76. The exposure quantity control system 76 performs continuous adjustment, etc., of a light emitting timing and a quantity of the light emitted from the pulse laser source 71 through a source system 82 for the laser source.

The exposure quantity control system 76 is a control system for making a quantity of an integrated exposure for a wafer 105 to be an optimal exposure quantity. The main control 7 which manages an operation of the whole apparatus in a generalizable manner comprises the exposure quantity control system 76, an exposure mode determination means 79 for determining a following exposure mode (the step-and-repeat mode or the step-and-scan mode) and a target integrated exposure mode, a memory 80 for storing various kinds of data, etc. Also, the operator supplies information on a kind of the reticle 96 to be exposed next, the photosensitivity of a photoresist on the wafer 105 (target integrated exposure quantity), a layout of shot regions on the wafer (a shot layout), and so on, to a control means 78 inside the main control system 77 through a keyboard 71. An exposure mode to be used next is determined by the exposure mode determination means 79 on the basis of the above-mentioned information. Note that the control means 78 and the exposure mode determination means 79 in the present embodiment are software functions in the computer.

The fly eye lens 74B is disposed so as to be replaced with the fly eye lens 74A of the first group through a fly eye lens replacing apparatus 83. Pulse laser beams emitted from a multiplicity of secondary light sources on an ongoing plane of the fly eye lens 74A (or 74B) are, after passing through a collimator lens 84, deflected by a vibration mirror 85, and then fall on a fly eye lens 87A of a second group. The vibration mirror 85 vibrates the laser beams to a predetermined direction by use of a vibrator 86, whereby an unevenness in the illuminance generated on the wafer 105 under the influence of an interference fringe of the laser beams having strong coherency is attenuated. In this case, the ongoing plane of the fly eye lens 4A of the first group is conjugate to the ongoing plane of the fly eye lens 87A of the second group, as shown as an optical path indicated by a broken line. Also, the incident plane of the fly eye lens 87A of the second group is conjugate to a pattern plane of a reticle 96.

Also, for the fly eye lens 87A of the second group, the fly eye lens 87B is disposed to be replaceable therewith through the fly eye lens replacing apparatus 83.

Since a configuration (size) of the illumination region on the reticle 96 in the step-and-repeat method is different from that in the step-and-scan method and an incident plane of each lens element of the fly eye lens 87A of the second group is conjugate to the illumination region on the reticle 96, it is required to optimize a length-to-breadth ratio (configuration) of the lens element of the fly eye lens in accordance with an exposure method (the illumination region on the reticle 96). That is, in this embodiment, the fly eye lenses 87A and 87B of the second group are used when the exposure is effected by the step-and-repeat method and the step-and-scan method, respectively. In the same way, the fly eye lenses 74A and 74B of the second group are used when the exposure is effected by the step-and-repeat method and the step-and-scan method, respectively.

Pulse laser beams (hereinafter termed an illumination light) IL emitted from a tertiary light source of the ongoing plane of the fly eye lens 87A (or 87B) of the second group are condensed by a first relay lens 88 to reach a fixed blind (fixed field stop) 89. The fixed blind 89 is arranged to retract from an optical path of the illumination light IL through a blind control apparatus 90 any time under a command of the exposure quantity control system 76. The illumination light IL passing through an aperture of the fixed blind 89 falls on a movable blind which is comprises of four movable blinds (only two movable blinds 91A and 91B are illustrated in FIG. 13). The illumination light IL passing through the aperture of the movable blind further passes through a second relay lens 93, a mirror 94 for bending the optical path, and a main condenser lens 95, and then illuminates an illumination region 97 of the lower plane (a pattern plane) of the reticle 96 with uniformly distributed illuminance. Then, a pattern image within the illumination region 97 of the reticle 96 is projected onto an exposure region 106 on the wafer 105 through a projection optical system 104.

In this case, the movable blades 91A, 91B, and so on, are supported so as to go forward or backward in a direction perpendicular to the optical axis AX by use of opening/closing mechanisms 92A, 92B and so on, respectively. Operations of the opening/closing mechanisms 92A, 92B, and so on, are controlled by the blind control apparatus 90. A plane on which the movable blind consisting of the movable blades 91A, 91B, etc., (hereinafter termed the movable blinds (91A and 91B)) are disposed is conjugate to the pattern plane of the reticle 96. A plane on which the fixed blind 89 is disposed is at a position slightly deviating from the plane conjugate to the pattern plane of the reticle 96. In this embodiment, the fixed blind 89 is used to determine the slit-like illumination region on the reticle 96 when the exposure is effected in the step-and-scan mode. Therefore, when the exposure is effected in the collective-exposure mode, the fixed blind 89 is retracted from the optical path for the illumination light IL through the blind control apparatus 70.

When the exposure is effected in the step-and-scan mode, it is feared that the pulse illumination light IL passing through the outer side of the light-shielding band which surrounds the patterns to be transferred of the reticle 96 upon start and completion of the scan-exposure may sensitize a photoresist on the wafer 105 when only the fixed blind 89 is used. Then, upon the start or completion of the scan-exposure, the movable blinds (91A and 91B) are gradually opened or closed in synchronization with scans of the reticle stage and the wafer stage, in respective scan directions. Thus, unnecessary pattern exposure can be prevented. When the scan-exposure is effected, since the movable blinds (91A and 91B) are used instead of a shutter, the pulse laser source 1 may effect pulse emission during a time from opening of the movable blinds (91A and 91B) to fully closing.

On the other hand, when the exposure is effected in the step-and-repeat mode, the configuration and the size of the illumination region on the reticle 96 are determined by the movable blinds (91A and 91B). When the static-exposure for step-and-repeat type is effected, a quantity of integrated exposure is measured by, for example, an unillustrated photoelectric detector (integrator sensor). Light emission from the pulse laser source 71 is stopped at the time when this integrated exposure quantity reaches the target exposure quantity.

Next, a stage mechanism, etc., in this embodiment will be described. Herein, the axis Z is taken in parallel to the optical axis AX of the projection optical system 104, the axis X is taken on a plane perpendicular to the axis Z and in parallel to a sheet plane shown in FIG. 13, and the axis Y is taken perpendicular to the sheet plane shown in FIG. 13. First, the reticle 96 is held on the reticle stage 98, and the reticle stage 98 is movably mounted on a reticle base 99 in the X direction via a linear motor 100. A moving mirror 101 is fixed on one end of the reticle stage 99, the X coordinate of the reticle stage 98 is measured by a laser interferometer 102 which is provided externally and emits laser beams to this moving mirror 101, and the measured X coordinate is supplied to a stage control system 103. The stage control system 103 controls an operation of the linear motor 100 on the basis of the supplied X coordinate. Note that there are provided between the reticle stage 98 and the reticle 96 an unillustrated micromotion stage for microscopically moving the reticle 96 in the X direction, the Y direction and the rotational direction (the θ direction).

The wafer 105 is supported on a Z-levelling stage 108 which moves the wafer 105 in the Z direction and performs a levelling, and is mounted on a wafer base 110 via a Y stage 109Y and an X stage 109X. The X stage 109X is X-directionally driven by the driving motor 113 with respect to the wafer base 110, while the Y stage 109Y is Y-directionally driven by an unillustrated driving motor with respect to the X stage 109X. An L-shaped moving mirror 111 for the X axis and the Y axis is fixed on the Z-levelling stage 108. An external laser interferometer 112 for irradiating laser beams onto this moving mirror 111 measures an X coordinate and a Y coordinate of the Z-levelling stage 108, and supplies the measured coordinates to the stage control system 103. The stage control system 103 controls operations of the X stage 109X and the Y stage 109Y through the driving motor 113, etc., on the basis of the supplied X coordinate and the Y coordinate.

More specifically, when the exposure is effected in the step-and-scan mode, if a projection magnification to be conducted by the projection optical system 104 is β (β is, for example, ¼ or ⅕), the wafer 105 is −X-directionally (or +X-directionally) scanned reticle 96 is scanned at a speed $V_W (=\beta \cdot V_R)$ via the X stage 109X in synchronization with the +X-directional (or −X-directional) scanning of the reticle 96 at the speed $V_R$ via the reticle stage 98. On this occasion, a very small positional deviation, a deviation of a rotation angle, and a deviation of a speed are compensated by an unillustrated micromotion stage disposed on the reticle 96 side. Also, when the plurality of shot regions on the wafer 105 are successively exposed in the step-and-scan mode, a motion of the wafer-105 among the shot regions is effected by the stepping of the X stage 109X and the Y stage 109Y. That is, the exposure is effected by the step-and-scan method.

Next, when the exposure is effected in the step-and-repeat mode, the exposure is effected in a state where the reticle 96 and the wafer 105 are remain at a standstill. A motion among the plurality of shot regions on the wafer 105 is conducted by stepping of the X stage 109X and the Y stage 109Y. That is, the exposure is effected by the step-and-repeat method. However, a quantity of a positional deviation (a remaining error) between the reticle 96 and each shot region on the wafer 105 is compensated by an unillustrated micromotion stage on the reticle 96 side.

The projection optical system 104 is provided with a lens controller 107. The lens controller 107 compensates image forming characteristics such as a projection magnification of the projection optical system 104, distortions, etc., by adjusting a pressure of a gas sealed up in a space between predetermined lenses inside the projection optical system 104, or by adjusting a position in the direction of the optical axis AX of a predetermined lens which constitutes the projection optical system 104, or by adjusting an angle of inclination of said lens. When the illumination light IL is continuously irradiated onto the projection optical system 104, the image forming characteristics of the projection optical system 104 are changed due to heat accumulation. As a result, the main control system 77 offsets the changes of said image forming characteristics through a lens controller 107. On this occasion, a distribution of luminance of light beams in the projection optical system 104 in the step-and-repeat mode is different from that in the step-and-scan mode so that a quantity of change of the image forming characteristics is also different. A quantity of change of the image forming characteristics in the step-and-repeat mode and that in the step-and-scan mode are stored in advance in a memory 80 of the main control system 77, and the main control system 97 controls an operation of the lens controller 107 in accordance with an exposure mode.

Further, though unillustrated, the projection exposure apparatus in the present embodiment is provided with alignment system of the TTR (through the reticle) method, the TTL (through the lens) method, or the off-axis method. A quantity of a positional deviation between the reticle 96 and each shot region on the wafer 105 is measured by this alignment system. Then, when the exposure is effected in the step-and-scan mode, the quantity of the positional deviation between the reticle 96 and said shot region is adjusted to be within a permissible value at the start of the scan, and a quantity of a positional deviation at a corresponding alignment mark is adjusted to be within the permissible value even during the scan if necessary. Moreover, when the exposure is effected in the step-and-repeat mode, said positional deviation is adjusted to be within the permissible range before the exposure, and the adjusted state is maintained during the exposure.

Next, in the present embodiment, a specific description will be made on which mode, the step-and-repeat mode or the step-and-scan mode, the exposure mode determination means 79 in the main control system 77 selects.

A. When a throughput (the number of wafers to be processed per unit time) is used as a criterion.

First, if a time required for wafer replacement or wafer alignment is denoted by WA [sec], a time required for a stepping among the shot regions on the wafer by S [sec], and a time required for an exposure by EX [sec], a throughput T [the number of wafers per hour] can be obtained by the following expression.

$$=3600/(WA+S+EX) \quad (1)$$

In this case, there is no substantial difference in the time WA required for the replacement and the alignment, and the stepping time S between the static-exposure and the scan exposure. On the contrary, there arises a large difference in the exposure time EX.

First, the exposure time $EX_{scan}$ is obtained, by expressing the exposure EX in the step-and-scan mode as $EX_{scan}$. For this reason, when the projection magnification by the projection optical system 104 is denoted by β [times], the sensitivity of the photoresist on the wafer 105 by P [mJ/cm²], the X-directional width (the slit width) of the exposure region 106 on the wafer 105 by W [mm], the Y-directional length of said exposure region 106 by L [mm], the laser power of the pulse laser source 1 by E [mW], composite transmissivity from the pulse laser source 1 to the wafer 105 by μ, the frequency of the laser oscillation by F [Hz], and the minimum number of pulses in the exposure region 106 determined based on a quantity of light irradiation onto the wafer 105 by $N_m$ [number of pulses], the following expression is given.

$$N_m = \mu \cdot P \cdot E / (W \cdot L \cdot F) \quad (2)$$

Then, if the minimum number of pulses in the exposure region 106 which is determined by an unevenness in a light quantity for each pulse from the pulse laser source 1 is denoted by $N_e$ [the number of pulses] and min (x, y) indicates x or y, whichever smaller, the minimum number of pulses N of the illumination light IL which is irradiated when one point on the wafer 105 finally crosses the exposure region 106 in the X direction [the number of pulses] is expressed as follows.

$$N = \min(N_e, N_m) \quad (3)$$

The scan velocity $V_R$ [mm/sec] of the reticle 96 required for the above case, is expressed as follows.

$$V_R = (W \cdot F)/(N \cdot \beta) \quad (4)$$

When the length to each shot region on the wafer 105 in the scan direction (the X direction) is denoted by a [mm] and the number of shot regions M, the exposure time $EX_{scan}$ is expressed as follows.

$$EX_{scan} = M \cdot (a+W)/(V_R \cdot \beta) \quad (5)$$

This is an exposure time per wafer required for the scan-exposure, which time depends on the scan velocity $V_R$ of the reticle. Therefore, if a high-speed reticle stage 98 is not developed, the exposure time becomes long and the throughput is lowered.

On the other hand, when the exposure time EX in the expression (1) in the step-and-repeat mode is expressed as $EX_{stil}$, the express time $EX_{stil}$ is obtained. In this case, if the size (the field size) of the exposure region on the wafer 106 is denoted by a×b [mm], the minimum number of pulses $N_m$ which is determined by a target exposure quantity onto the wafer 105 is expressed in the following expression.

$$N_m = \mu \cdot P \cdot E / (a \cdot b \cdot F) \quad (6)$$

Then, if the minimum number of pulses which is determined based on an unevenness in a light quantity for each pulse emission is denoted by $N_e$, the minimum number of pulses N [the number of pulses] of the illumination light IL finally irradiated onto the wafer 105 is expressed as follows.

$$N = \min(N_e, N_m) \quad (7)$$

Then, if the number of shots is M', the exposure time $EX_{stil}$ is expressed as follows.

$$EX_{stil} = M' \cdot N/F \quad (8)$$

Therefore, the exposure time $EX_{stil}$ is not restricted by the scan velocity $V_R$ of the reticle stage 98, as a matter of course.

For example, when two chip patterns are included in each shot region, the minimum number of pulses N is a small value in a region where the photoresist has a high sensitivity according to the expressions (6) to (8). As a result, the exposure time is shorter in a case where a two-shot exposure is effected for each shot region in the step-and-repeat mode than in a case where each shot is exposed in the step-and-scan mode. Therefore, the throughput is higher in the step-and-repeat mode.

On the contrary, in a region where the photoresist has a low sensitivity, an area of the exposure region on the wafer 105 in the step-and-repeat mode is wider than that in the step-and-scan mode so that the luminance in the exposure region is lowered to prolong the exposure time. Therefore, the throughput is higher in the step-and-scan mode.

FIG. 14 shows a relationship between the sensitivity P of the photoresist and the throughput T. In FIG. 14, a curve 121 indicates the throughput in the step-and-scan mode, while a curve 122 the throughput in the step-and-repeat mode, respectively. As clearly seen from FIG. 14, the throughput is higher in the step-and-repeat mode when the sensitivity P of the photoresist is 0 to Po, and the throughput is higher in the step-and-scan mode thereafter. In the present embodiment, the exposure modes in which the throughput is higher is used in accordance with the sensitivity P of the photoresist.

B. When the configuration of a shot region on the wafer 105 is used as a criterion.

Figure 15A:
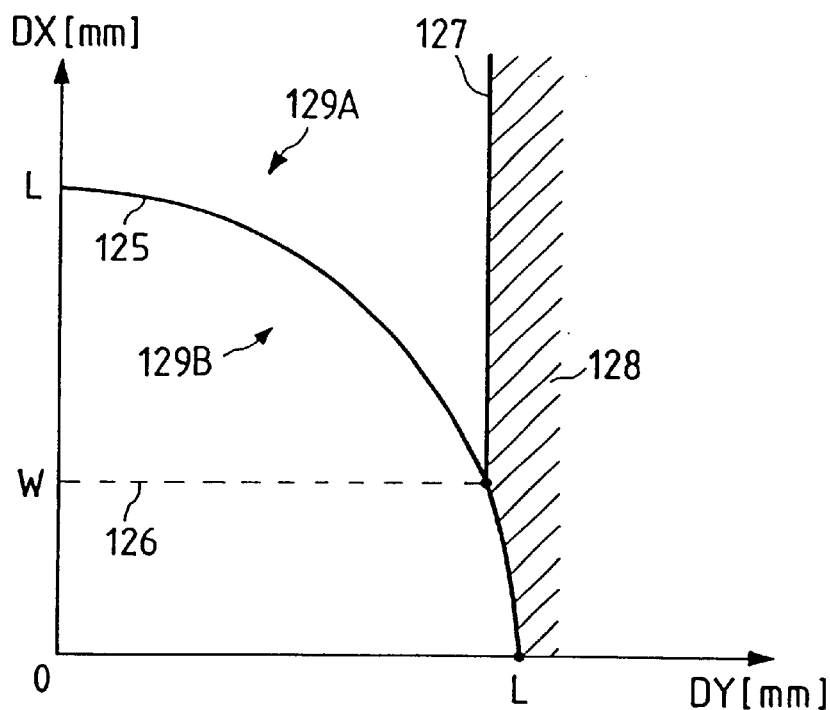
FIG. 15A is a graph showing a relation between a configuration of a shot region on a wafer and a usable exposure mode.
Figure 15B:
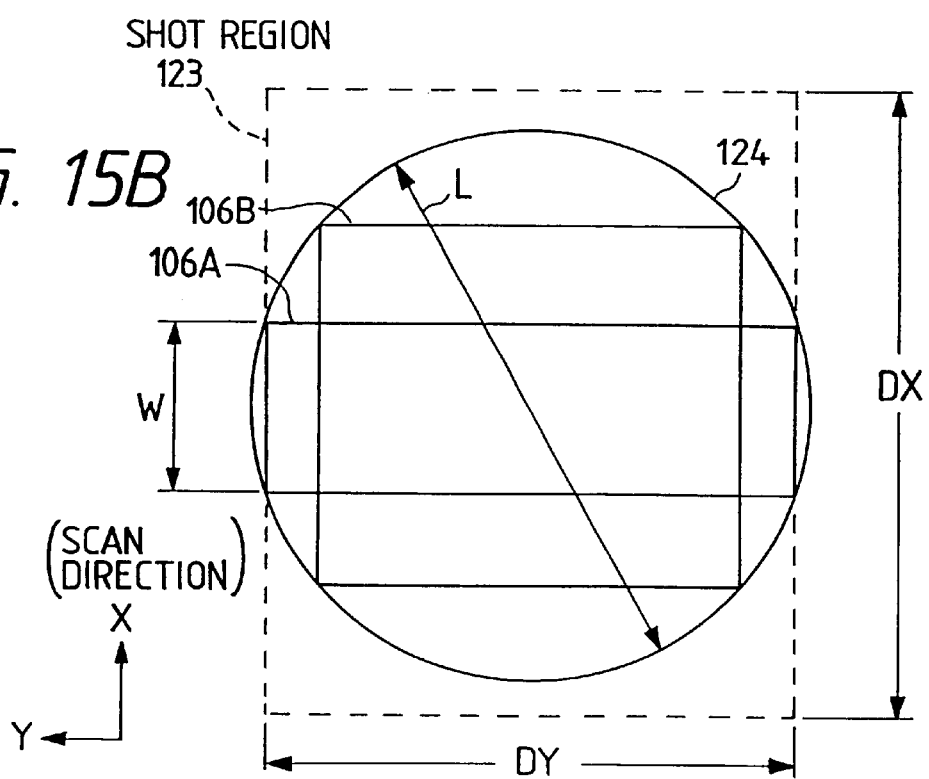
FIG. 15B is a view showing a relation between an exposure region on the wafer and the shot regions.

First, FIG. 15B shows a relationship between a shot region 123 on the wafer 105 and a circular effective exposure field 124 by the projection optical system 104. Referring to FIG. 15B, the width of the shot region 123 in the Y direction is denoted by DY, and the width in the X direction (the scan direction in the step-and-scan mode) by DX. If the diameter of the effective exposure field 124 is denoted by L, an exposure region 106A in the step-and-scan mode is a slit-like region having an X-directional width (slit width) W which is substantially inscribed to the effective exposure field 124. An exposure region 16B in the step-and-repeat mode is a region having an X-directional width smaller than the diameter L, and substantially inscribed to the effective exposure field 124. The shot region 123 in FIG. 15A has a Y-directional width DY which is equal to the width of the exposure region 106A and has an X-directional width DX which is longer than the diameter L. Therefore, in order to effect an exposure with one action, it is required to use the step-and-scan mode which effects a scan for the exposure region 106A.

FIG. 15A shows an exposure mode which can be used in accordance with the configuration of a shot region, in which the abscissa indicates the Y-directional width DY of the shot region, and the ordinate the X-directional width DX of the shot region. As seen from FIG. 15B, a region which is disposed outside an arc 129A having the radius L and which has a Y-directional width DY exceeding the Y-directional width of the exposure region having the slit width W when the Y-directional width of the shot region is W or more, that is, a hatched region 128 in FIG. 15A, becomes a region which can not be exposed. On the other hand, in FIG. 15A, a region 129B which is surrounded by an arc 125 having the radius L, the axis DX and the axis DY is a region which can be exposed in the step-and-repeat mode. Further, a region 129A surrounded by a straight line 126 which indicates the slit width W, a straight line 127 which passses through a point crossing the straight line 126 on the arc 125 and in parallel to the axis DX, and the axis DX is a region which can be exposed in the step-and-scan mode. Therefore, a region surrounded by the straight line 126, the arc 125 and the axis DX (a region in which the region 129B and the region 129A overlap with each other) can be exposed either in the step-and-scan mode or in the step-and-repeat mode. Thus, one of these exposure modes, whichever has a higher throughput, can be selected, as mentioned above.

In regions other than those, only one of the step-and-repeat mode and the step-and-scan mode can be used. Therefore, the exposure is effected in the usable exposure mode. When the Y-directional width of a shot region is too wide, like that of the region 128, the exposure can be effected neither in the step-and-repeat mode nor in the step-and-scan mode so that the exposure mode determination means 79 of the main control system 77 gives a warning indication on an unillustrated display apparatus, indicating that the exposure can not be effected.

C. When resolution and the distortion are used as criteria.

In the step-and-repeat method, in general, an uneven distortion in an image projected by the projection optical system depending on each of projection exposure apparatuses becomes an overlap error when the exposure is effected onto different layers on the wafer by use of these projection exposure apparatuses (mix-and-match). On the contrary, in step-and-scan method, since the wafer is X-directionally scanned with respect to the slit-like exposure region 106A (see FIG. 15B) so that the averaging effect can be obtained in said exposure region 106A, a quantity of distortion in the X direction which is a scan direction decreases. Therefore, it is considered that the overlap accuracy among the layers on the wafer is higher, compared with that in the step-and-repeat method. However, in an exposure by use of a single projection exposure apparatus, the overlap accuracy becomes higher in the step-and-repeat method in which there is no influenced of a distortion of the projection optical system.

With respect to a degree of resolution, with a wafer having a deteriorated flatness of the surface, a larger portion is liable to deviate from the range of depth of focus within an exposure region by the step-and-repeat method in which a wide shot region are exposed en bloc. On the other hand, it is possible to divide one shot region for an exposure and successively effect auto-focusing on each of divided regions by the step-and-scan method, whereby the entire shot region can be contained within the range of the focus depth easily.

However, by the step-and-scan method, a projection image is deteriorated by a distortion averaged within the slit-like exposure region. The projection image is also deteriorated by a vibration at the step-and-scan time. As a result, the depth of focus becomes substantially shallow, compared with that in the step-and-repeat method. Therefore, the exposure method in which an allowance (margin) of distribution of the focal positions on the entire shot region is larger for said depth of focus of the focal positions on the entire shot region for said depth of focus is larger when the substantial depth of focus is used as a criterion is selected.

When the exposure is effected on the second and subsequent layers on the wafer, a permissible value for an alignment accuracy between each shot region on the wafer and the reticle may be different in the step-and-repeat method and in the step-and-scan method, depending on the distortion, etc. Then, it is preferable to use the exposure mode with a larger permissible value for the alignment accuracy. However, as a matter of fact, an exposure mode is selected taking a substantial margin for the depth of focus and the permissible value for the alignment accuracy into consideration.

Figure 16A:
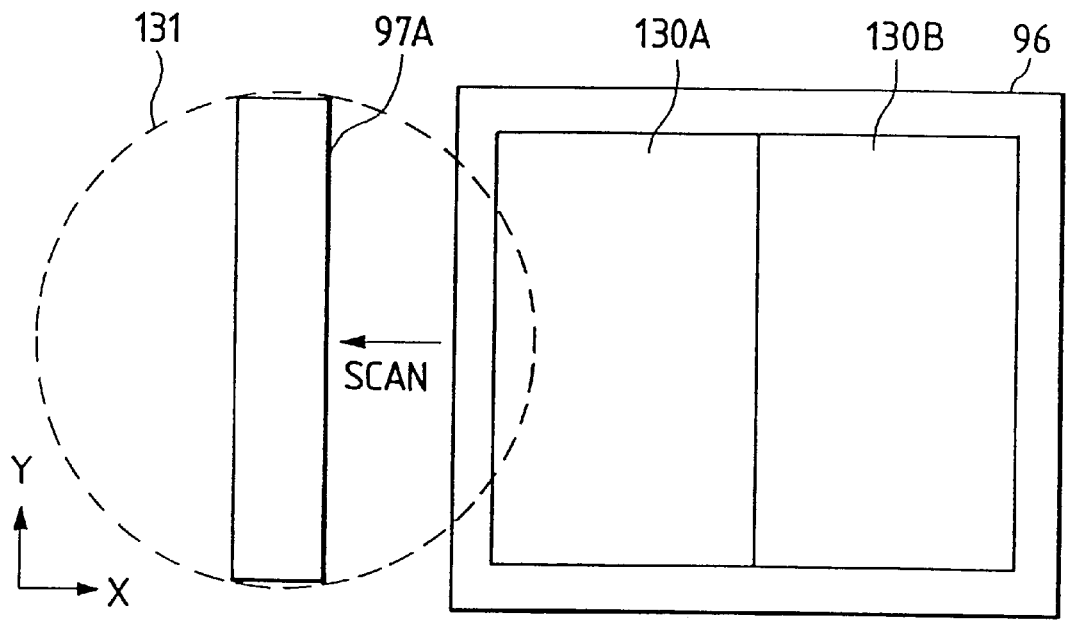
FIG. 16A is a plan view showing a relation between a reticle and an illumination region when an exposure is effected in the scan-exposure mode.

Next, description will be made of an operation after an exposure mode is determined by using the criteria mentioned above. First, when the step-and-scan method is selected, the reticle 96 is scanned in the −X direction (or the +X direction) with respect to the illumination region 97A, as shown in FIG. 16A. This illumination region 97A is inscribed to a circular region 131 which is conjugate to the effective field 124 in FIG. 15B. Herein, assuming that two identical circuit patterns 130A and 130B are formed on a pattern region on the reticle 96, the X-directional length of the circuit pattern 130A is smaller than the Y-directional width thereof, and the X-directional length of the both circuit patterns 130A and 130B as a whole is larger than the Y-directional width thereof.

Figure 17A:
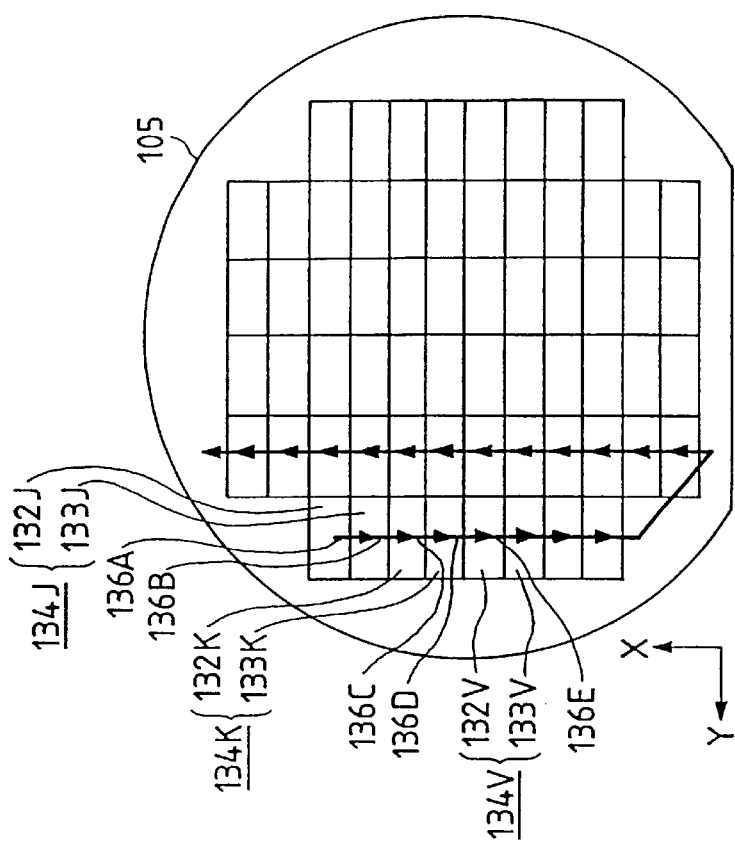
FIGS. 17A and 17B are views for explaining a relation between an exposure mode and a stepping direction.

In synchronization with the scan of the reticle 96, the shot regions 134A, 134B, 134C, . . . on the wafer 105 are respectively scanned in the +X direction (or the −X direction) with respect to the slit-like exposure region 106A, as shown in FIG. 17A. Each of these shot regions 134A, 134B, 134C, . . . is X-directionally divided into two sub-shot regions 132A, 133A, 132B, 133B, . . . . An image of the circuit pattern 130A in FIG. 16A is projected onto the first two sub-shot regions 132A and 132B, while an image of the circuit pattern 130B in FIG. 16A is projected onto the second two sub-shot regions 133A, 134B, . . . .

Also, though the exposure region 106A stands still actually and the wafer 105 is scanned, a locus of the exposure region 106A for the wafer 105 is denoted by the loci 135A, 135B, 135C, . . . in FIG. 17A. As seen from FIG. 17A, when an exposure is effected for a lot of shot regions on the wafer 105 successively in the step-and-scan mode, the shot regions 134A, 134B, 134C, and 134D in the first row which are disposed in the Y direction serving as a non-scanning direction are successively exposed first. Thereafter, the exposure action is shifted to the shot region 134E in the second row. At this time, a stepping among the shot regions in the first row is conducted in the non-scanning direction, as indicated by the loci 135B, 135D and 135F, and the stepping from the first row to the second row is conducted in a slanting manner, as indicated by the locus 135H.

In adjacent shot regions, as indicated by the loci 135A, 135C, 135E, 135G and 135I, the wafer 105 is scanned in the +X direction and the −X direction alternately for the exposure region 106A. In this manner, when the exposure is to be effected for the adjacent shot regions, the reticle 96 may be scanned in the −X direction and the +X direction alternately for the illumination region 97A, thereby avoiding a useless motion (idle returning) of the reticle stage 98. As described above, when the exposure is to be effected in the step-and-scan mode, it is possible to improve a throughput of the exposure process (productivity) by conducting the stepping in the non-scanning direction, thereby decreasing a useless motion of the stage mechanism.

Next, in order to successively effect an exposure of the two identical circuit patterns 130A and 130B on the reticle 96 shown in FIG. 16A onto a multiplicity of shot regions on the wafer 105 in the step-and-repeat mode, a taking-two method by which the two circuit patterns 130A and 130B are static exposed and a taking-one method by which one of the two circuit patterns 130A and 130B is used to effect the exposure can be considered.

When the taking-two method is employed, images of the two circuit patterns on the reticle 96 in FIG. 16A are exposed with respect to the shot regions 134A, 134B, 134C, . . . in the first row disposed, for example, in the Y direction, as shown in FIG. 17A by the step-and-repeat method, and the stepping is conducted in the Y direction. In this case, since the Y-directional length of the shot region 134A is smaller than the Y-directional width thereof, a distance to be stepped can be reduced by conducting the stepping in the Y direction, whereby the throughput of the exposure process can be improved, compared with the case in which the stepping is conducted in the X direction.

Figure 16B:
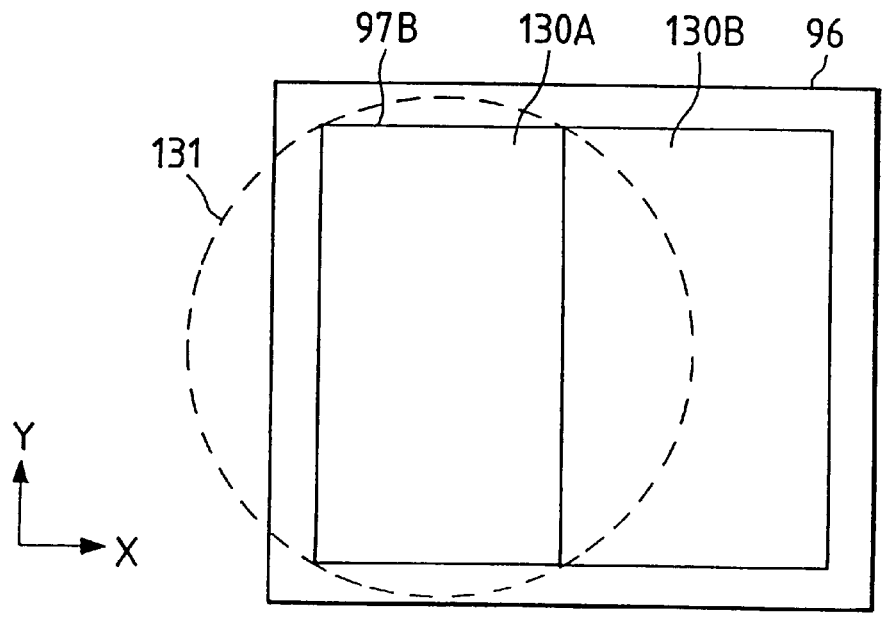
FIG. 16B is a plan view showing a relation between the reticle and the illumination region when the exposure is effected in the collective-exposure mode.
Figure 17B:
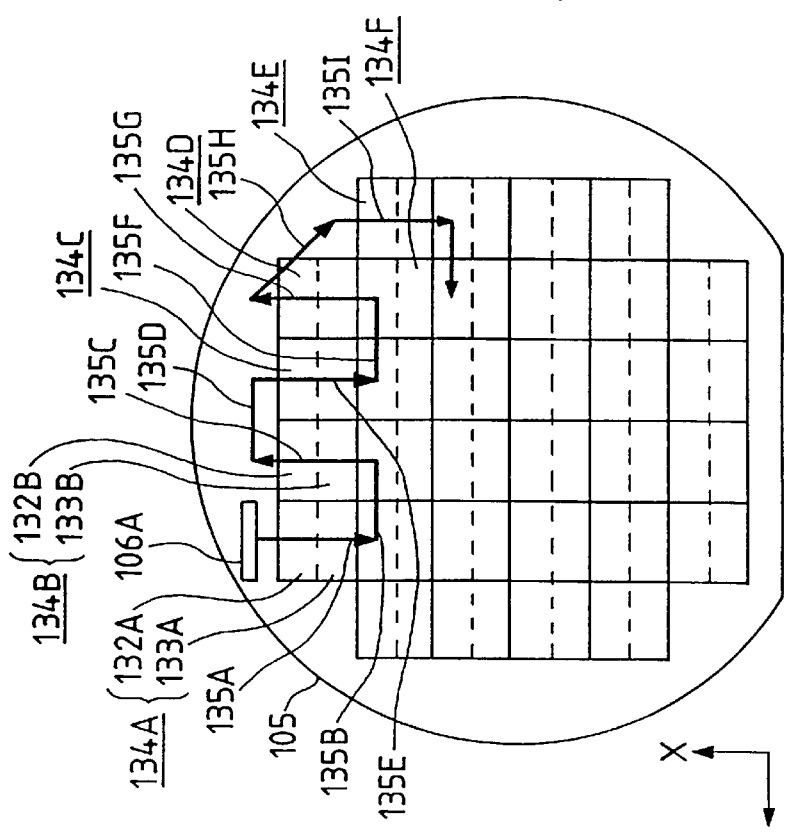

On the other hand, when the taking-one method is employed, the circuit pattern 130A, one on the reticle 96, is illuminated by the illumination region 97B at the exposure, as shown in FIG. 16B. Then, as shown in FIG. 17B, the exposure is effected by the step-and-repeat method for shot regions 134J, 134K, 134V, . . . , in the first row disposed in the X direction on the wafer 35. In this case, each of the shot regions 134J, 134K, 134V, . . . , is X-directionally divided into two sub-shot regions 132J, 133J, 132K, 133K, 132V, 133V, . . . , respectively, so that an image of the circuit pattern 130A in FIG. 16B is exposed two times on each of the shot regions 134J, 134K, 134V, . . . , respectively.

For this reason, the exposure field by the projection optical system is shifted to the X direction on the wafer 105, as indicated by the loci 136A, 136B, 136C, . . . , in FIG. 17B. These loci 136A, 136B, 136C, . . . also indicate an orbit of the stepping on the wafer 105. In this case, since the X-directional width of the sub-shot region 132J, for example, is smaller than the Y-directional width thereof so that the distance to be stepped is shorter, compared with the Y-directional stepping, thereby improving the throughput of the exposure process.

When the taking-one method is employed, compared with the case of the taking-two method mentioned above, the size of the illumination region on the reticle 94 becomes ½. Therefore, the illumination efficiency is deteriorated if the same fly eye lenses 74A and 87A are used. Then, a third fly eye lens is disposed replaceable with the fly eye lenses 74A and 74B of the first group, and another third fly eye lens is disposed replaceable with the fly eye lenses 87A and 87B of the second group. Then, the configurations of the lens elements of these two third fly eye lenses may be optimized for the step-and-repeat method and the taking-one method. Thereby, a degree of illuminance in the case of the taking-one method can be improved and the exposure time can be shortened.

Furthermore, according to this embodiment, since the configurations of the lens elements which constitute the fly eye lens of the first and second groups are switched over in FIG. 13, an angle of vibration of the vibration mirror 85 which removes spacial coherence may be changed. In this manner, it is possible to set the number of minimum exposure pulses required for limiting the influence of interference fringe caused by the pulse laser beams to a predetermined permissible value to be smaller, whereby the throughput of the exposure process can be improved.

In the foregoing embodiments, a pulse laser source is employed as the light source of the exposure light beams. However, the present invention can be applied to a case where continuous light beams such as i beam, g beam, etc., of a mercury lamp are used as the exposure light beams.

As described above, the present invention is not limited to the foregoing embodiments, and can be modified and altered within the scope of the claims of the present invention.

What is claimed is:

1. A scanning exposure apparatus which exposes a substrate with illumination light from a light source through a mask by moving the mask and the substrate relative to the illumination light, comprising:

a projection optical system disposed on an optical path through which the illumination light passes to project the illumination light from the mask onto the substrate;

a first movable member disposed at an object plane side of the projection optical system to move the mask relative to the illumination light;

a second movable member disposed at an image plane side of the projection optical system to move the substrate relative to the illumination light; and an actuator provided for the first movable member to rotate the mask about a predetermined point in an illumination area on which the illumination light is irradiated during scanning exposure of the substrate with the illumination light.

2. An apparatus according to claim 1, wherein said predetermined point is substantially aligned with a center of said illumination area.

3. An apparatus according to claim 2, wherein
said center of said illumination area is substantially aligned with an optical axis of said projection optical system.

4. An apparatus according to claim 3, wherein
said first movable member is moved to illuminate a plurality of chip patterns on said mask arranged in a scanning direction with said illumination light during said scanning exposure.

5. An apparatus according to claim 1, further comprising:
a first interferometer to detect a yawing amount of said first movable member, and a second interferometer to detect a yawing amount of said second movable member, wherein said mask is rotated in accordance with outputs of said first and second interferometers.

6. An apparatus according to claim 1, further comprising:
a mask interferometer to detect a yawing amount of said first movable member, wherein said mask is rotated in accordance with outputs of said mask interferometer.

7. An apparatus according to claim 1, further comprising:
a substrate interferometer to detect a yawing amount of said second movable member, wherein said mask is rotated in accordance with outputs of said substrate interferometer.

8. A scanning exposure apparatus which exposes a substrate with illumination light from a light source through a mask by moving the mask and the substrate relative to the illumination light, comprising:
a projection optical system disposed on an optical path through which the illumination light passes to project the illumination light from the mask onto the substrate;
a first movable member disposed at an object plane side of the projection optical system to move the mask relative to the illumination light;
a second movable member disposed at an image plane side of the projection optical system to move the substrate relative to the illumination light; and
an actuator provided for the second movable member to rotate the substrate about a predetermined point in an illumination area on which the illumination light is irradiated during scanning exposure of the substrate with the illumination light.

9. An apparatus according to claim 8, wherein
said predetermined point is substantially aligned with a center of said illumination area.

10. An apparatus according to claim 9, wherein
said center of said illumination area is substantially aligned with an optical axis of said projection optical system.

11. An apparatus according to claim 10, wherein
said first movable member is moved to illuminate a plurality of chip patterns on said mask arranged in a scanning direction with said illumination light during said scanning exposure.

12. An apparatus according to claim 8, further comprising:
a first interferometer to detect a yawing amount of said first movable member, and a second interferometer to detect a yawing amount of said second movable member, wherein said substrate is rotated in accordance with outputs of said first and second interferometers.

13. An apparatus according to claim 8, further comprising:
a mask interferometer to detect a yawing amount of said first movable member, wherein said substrate is rotated in accordance with outputs of said mask interferometer.

14. An apparatus according to claim 8, further comprising:
a substrate interferometer to detect a yawing amount of said second movable member, wherein said substrate is rotated in accordance with outputs of said substrate interferometer.

15. A scanning exposure method, comprising:
moving a mask and a substrate relative to illumination light to effect scanning exposure of the substrate with the illumination light through the mask; and
rotating the mask about a predetermined point in an illumination area on which the illumination light is irradiated during the scanning exposure to correct a relative rotation error between the mask and the substrate.

16. A method according to claim 15, wherein
said mask is rotated with respect to a center of said illumination area.

17. A method according to claim 16, wherein
said center of said illumination area is substantially aligned with an optical axis of a projection optical system.

18. A method according to claim 17, wherein
said mask includes a plurality of chip patterns arranged in a scanning direction and illuminated with said illumination light during said scanning exposure.

19. A method according to claim 15, further comprising:
detecting a yawing amount between said mask and said substrate during said scanning exposure in order to rotate said mask in accordance with the detected yawing amount.

20. A method according to claim 15, further comprising:
detecting, during the scanning exposure, a yawing amount of a mask movable member which holds the mask by using a mask interferometer, wherein the mask interferometer during the scanning exposure.

21. A method according to claim 20, further comprising:
detecting, during the scanning exposure, a yawing amount of a substrate movable member which holds the substrate by using a substrate interferometer, wherein the mask is rotated in accordance with outputs of said substrate interferometer during the scanning exposure.

22. A scanning exposure method, comprising:
moving a mask and a substrate relative to illumination light to effect scanning exposure of the substrate with the illumination light through the mask; and
rotating the substrate about a predetermined point in an illumination area on which the illumination light is irradiated during the scanning exposure to correct a relative rotation error between the mask and the substrate.

23. A method according to claim 22, wherein
said substrate is rotated with respect to a center of said illumination area.

24. A method according to claim 23, wherein
said center of said illumination area is substantially aligned with an optical axis of a projection optical system.

25. A method according to claim 24, wherein
said mask includes a plurality of chip patterns arranged in a scanning direction and illuminated with said illumination light during said scanning exposure.

26. A method according to claim 22, further comprising:
detecting a yawing amount between said mask and said substrate during said scanning exposure in order to rotate said substrate in accordance with the detected yawing amount.

27. A method according to claim 22, further comprising:

detecting, during the scanning exposure, a yawing amount of a substrate movable member which holds the substrate by using a substrate interferometer, wherein the substrate is rotated in accordance with outputs of said substrate interferometer during the scanning exposure.

28. A method according to claim 27, further comprising:

detecting, during the scanning exposure, a yawing amount of a mask movable member which holds the mask by using a mask interferometer, wherein the substrate is rotated in accordance with outputs of said mask interferometer.

* * * * *

UNITED STATES PATENT AND TRADEMARK OFFICE
CERTIFICATE OF CORRECTION

PATENT NO.      : 6,462,807 B1
DATED           : October 8, 2002
INVENTOR(S)     : Kenji Nishi It is certified that error appears in the above-identified patent and that said Letters Patent is hereby corrected as shown below:

<u>Title page,</u>
Item [30], Foreign Application Priority Data, "Sep. 1, 1997 (WO) ………. PCT/EP/04739" should be deleted.

Signed and Sealed this

Fifth Day of August, 2003

JAMES E. ROGAN
*Director of the United States Patent and Trademark Office*